US 010090348B2

(12) United States Patent
Kim et al.

(10) Patent No.: US 10,090,348 B2
(45) Date of Patent: Oct. 2, 2018

(54) IMAGE SENSOR HAVING GUARD DAMS

(71) Applicant: SK hynix Inc., Gyeonggi-do (KR)

(72) Inventors: Do-Hwan Kim, Chungcheongbuk-do (KR); Jae-Won Lee, Chungcheongbuk-do (KR)

(73) Assignee: SK Hynix inc., Gyeonggi-do (KR)

( * ) Notice: Subject to any disclaimer, the term of this patent is extended or adjusted under 35 U.S.C. 154(b) by 18 days.

(21) Appl. No.: 15/463,111

(22) Filed: Mar. 20, 2017

(65) Prior Publication Data

US 2018/0069036 A1 Mar. 8, 2018

(30) Foreign Application Priority Data

Sep. 2, 2016 (KR) ........................ 10-2016-0113004

(51) Int. Cl.
*H01L 31/054* (2014.01)
*H01L 27/146* (2006.01)

(52) U.S. Cl.
CPC ...... *H01L 27/1463* (2013.01); *H01L 27/1462* (2013.01); *H01L 27/14621* (2013.01); *H01L 27/14623* (2013.01); *H01L 27/14636* (2013.01); *H01L 27/14643* (2013.01)

(58) Field of Classification Search
CPC .......... H01L 27/1463; H01L 27/14643; H01L 27/14636; H01L 27/14623; H01L 27/1462; H01L 27/14621; H01L 31/0216; H01L 31/0232; H01L 31/054; H01L 29/0619–29/0623; H01L 27/14618; H01L 25/065–25/0657
See application file for complete search history.

(56) References Cited

U.S. PATENT DOCUMENTS

| 8,659,060 | B2 | 2/2014 | Koike |
| 2009/0085143 | A1 | 4/2009 | Park |
| 2010/0133635 | A1 | 6/2010 | Lee et al. |
| 2015/0115386 | A1* | 4/2015 | Chuang ............ H01L 27/14603 257/443 |

FOREIGN PATENT DOCUMENTS

KR 1020110065179 6/2011

* cited by examiner

*Primary Examiner* — Julio J Maldonado
*Assistant Examiner* — Stanetta Isaac
(74) *Attorney, Agent, or Firm* — IP & T Group LLP

(57) ABSTRACT

An image sensor is described. The image sensor may include a substrate including a pixel area, a logic area, and a guard area disposed between the pixel area and the logic area. The guard area may substantially prevent transfer of heat generated in the logic area from reaching the pixel area.

20 Claims, 31 Drawing Sheets

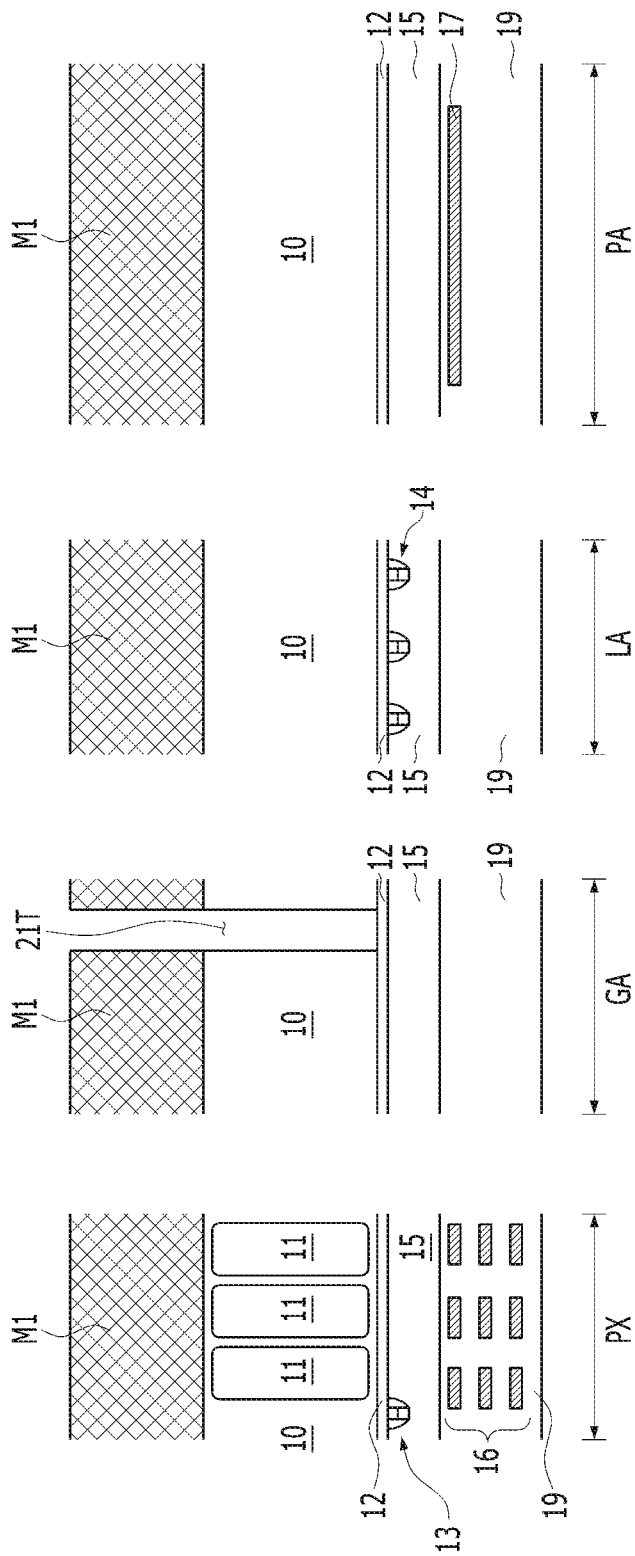

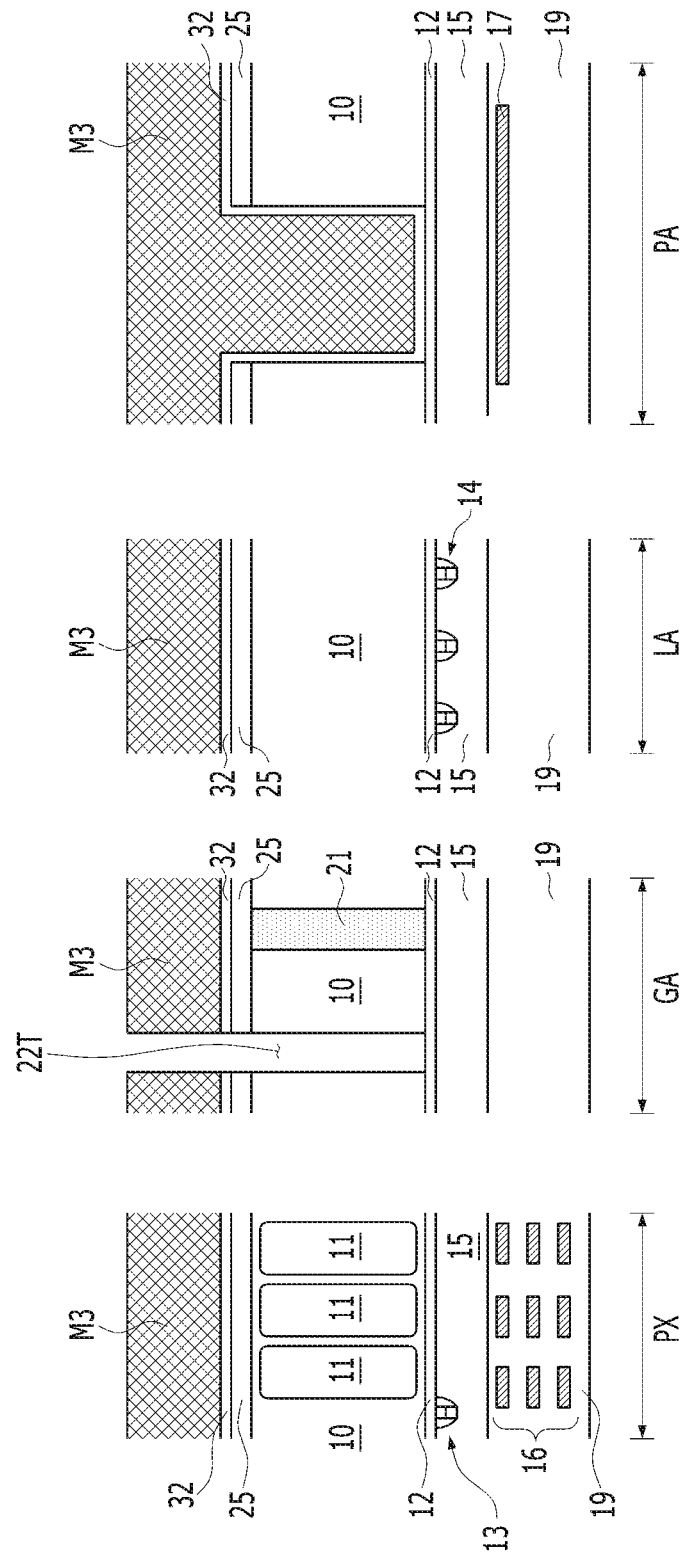

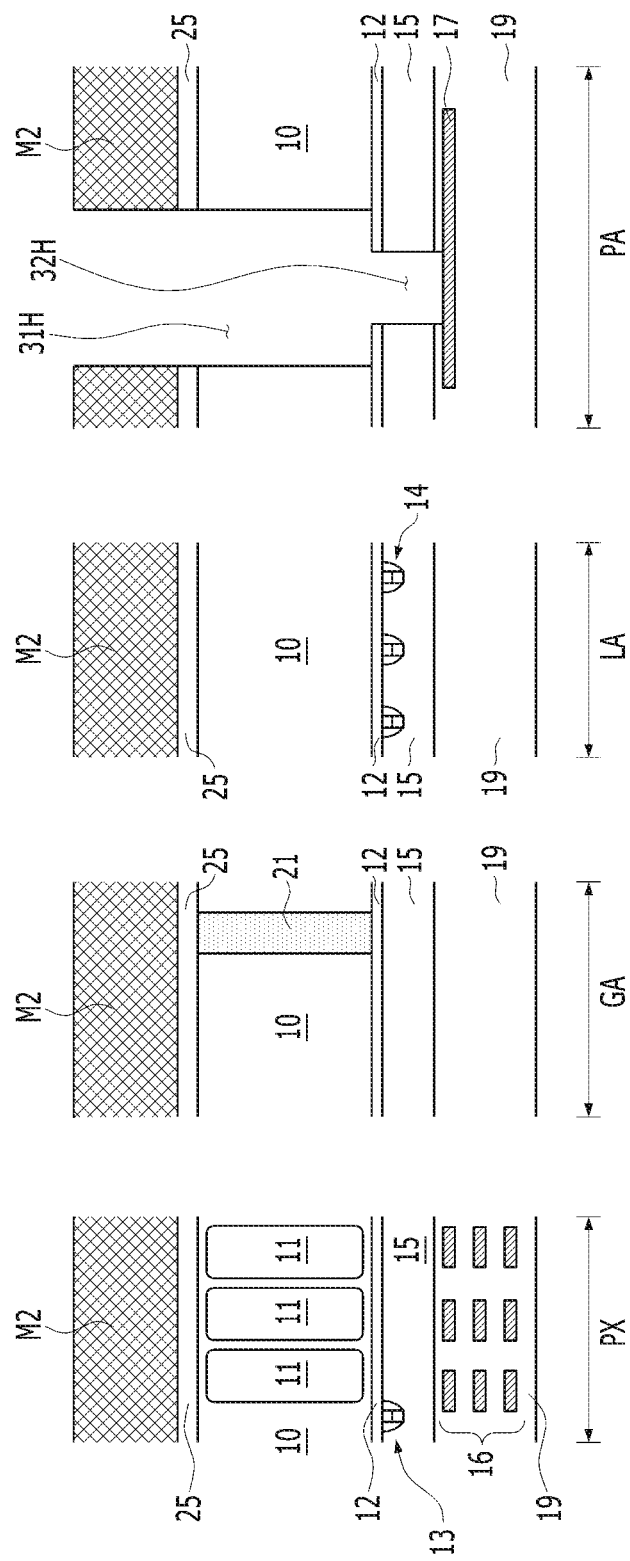

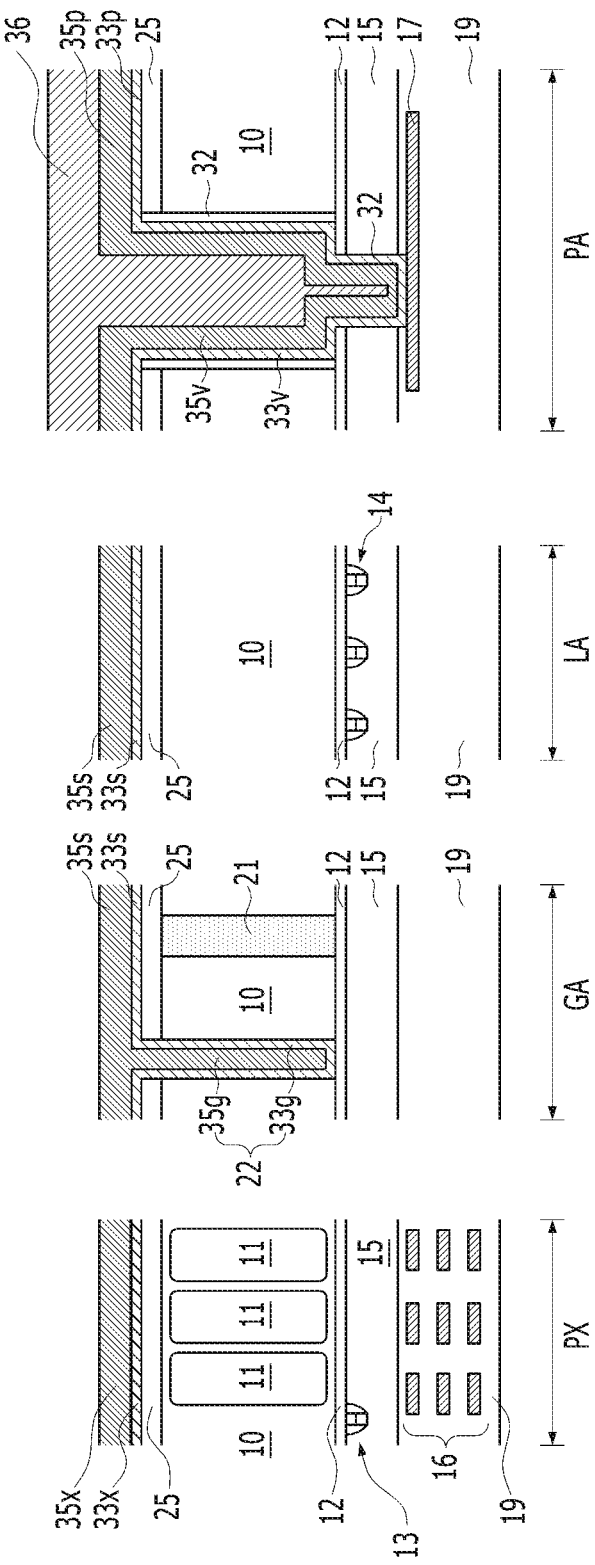

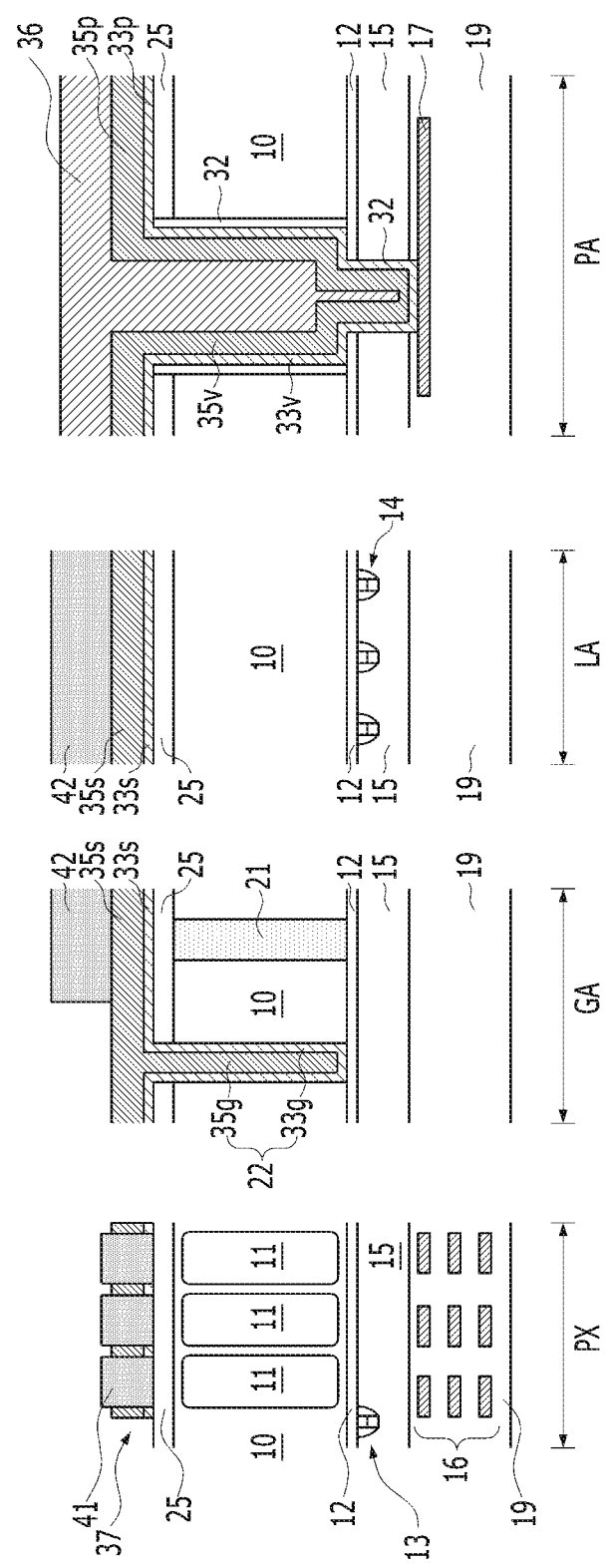

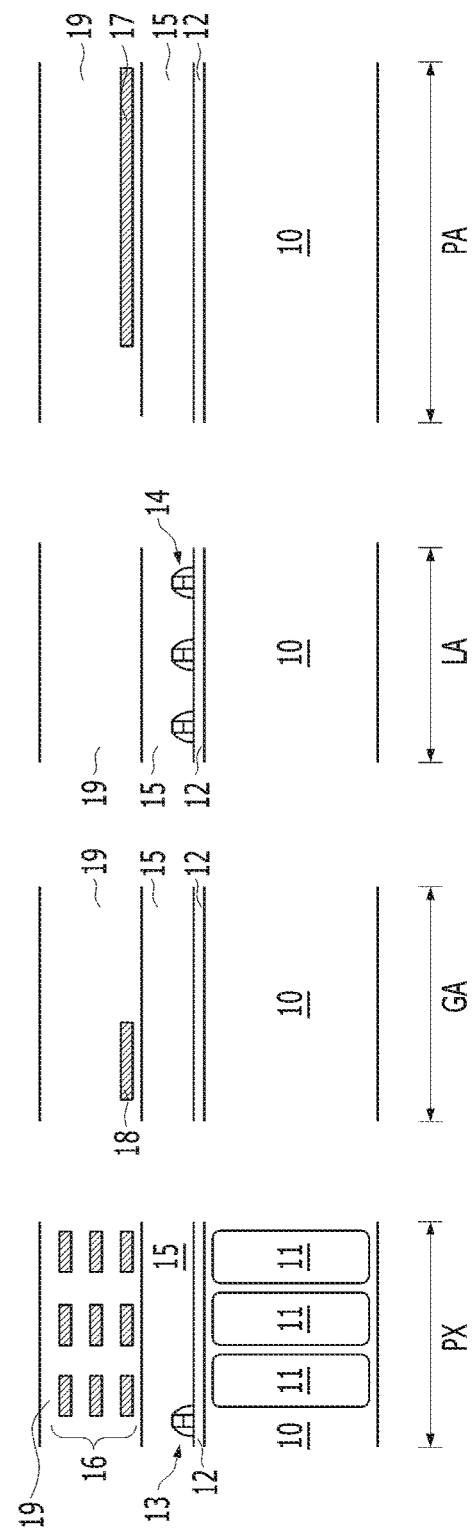

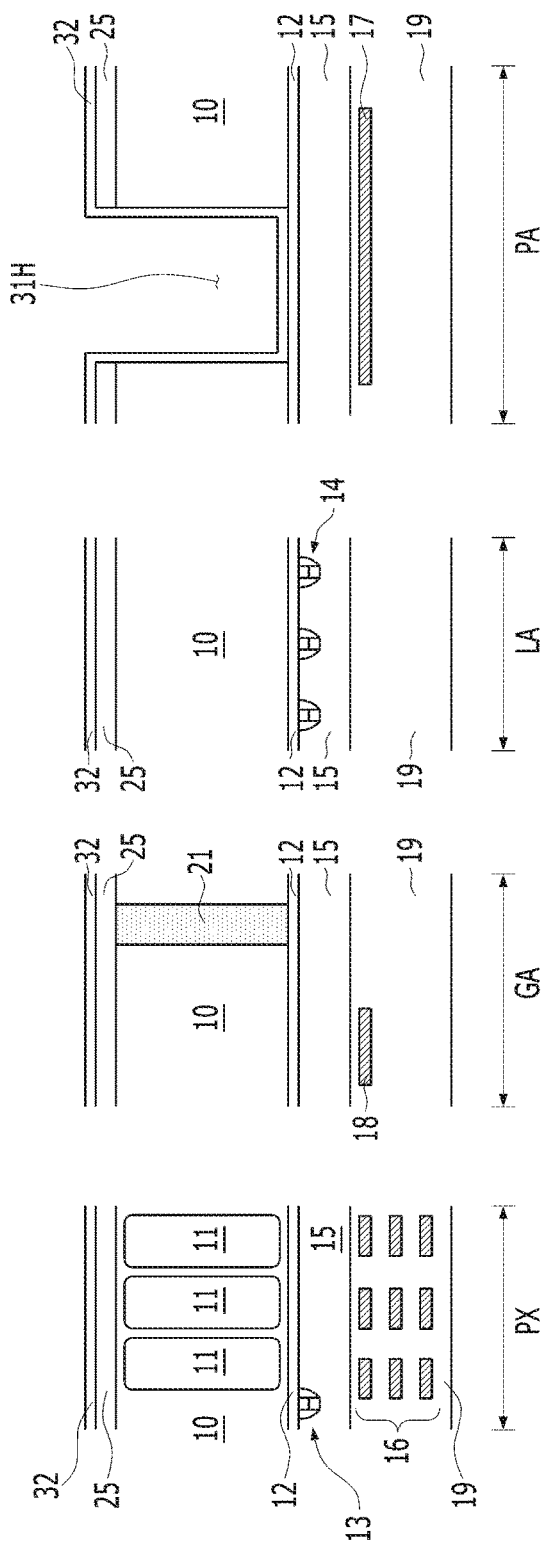

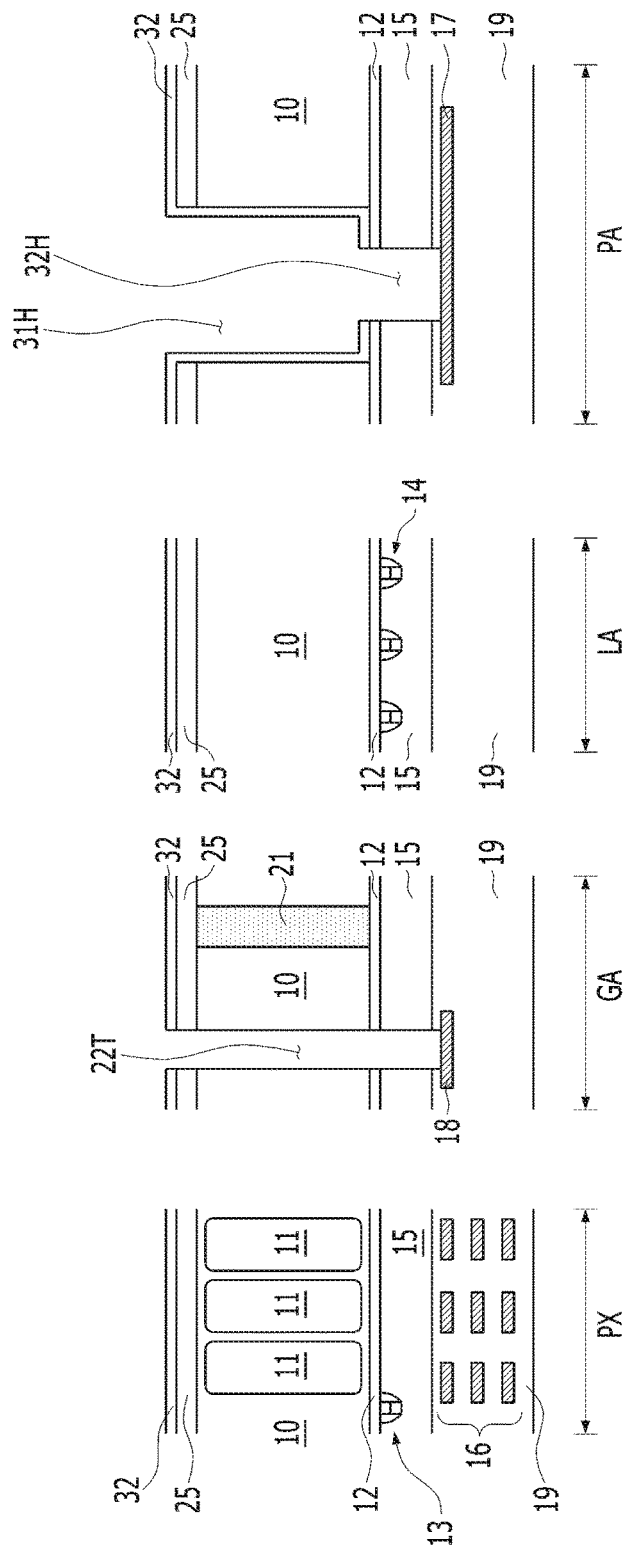

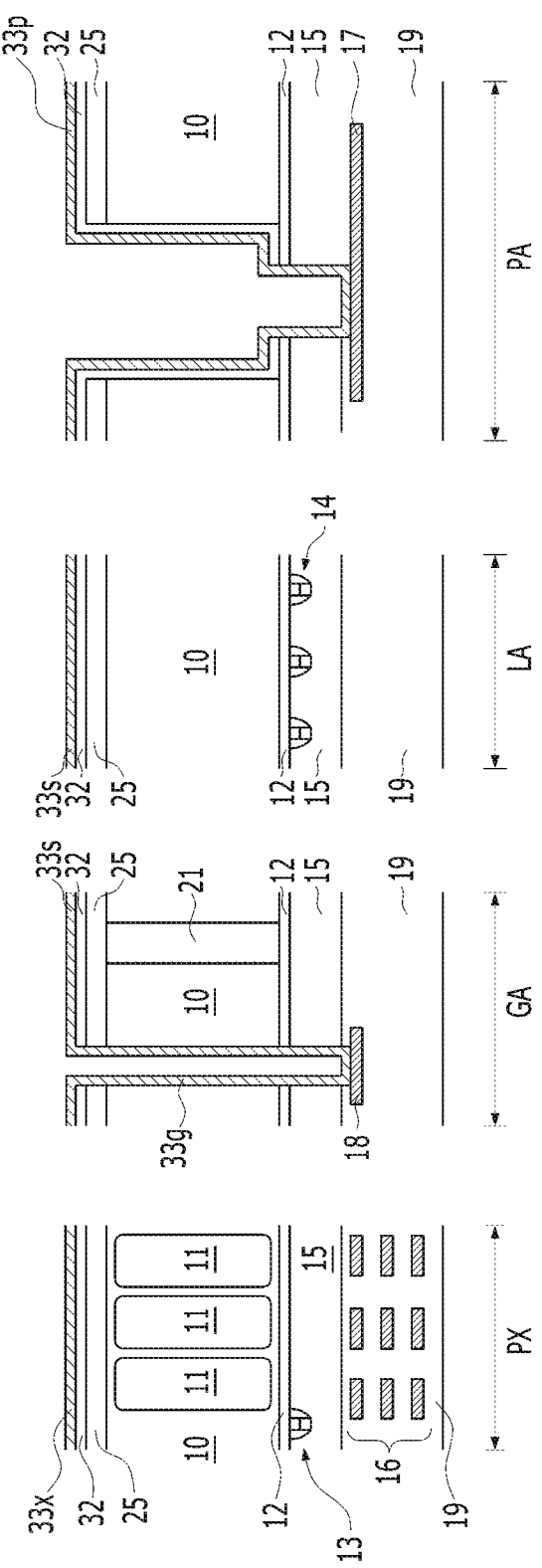

ially embodiments of the present invention provide
IMAGE SENSOR HAVING GUARD DAMS

CROSS-REFERENCE TO RELATED APPLICATIONS

The present application claims priority of Korean Patent Application No. 10-2016-0113004, filed on Sep. 2, 2016, which is incorporated herein by reference in its entirety.

BACKGROUND

1. Field

Exemplary embodiments of the present invention provide an image sensor having guard dams for blocking off the transmission of heat and for emitting the heat.

2. Description of the Related Art

An image sensor is a device that converts an optical image into electrical signals. Recent advancements in the computer and communication industries call for increased demands for high-performance stack-type image sensors in diverse fields, such as digital cameras, camcorders, personal communication systems (PCS), game players, security cameras, medical micro cameras, robots and so forth. An image sensor may include a pixel area and a logic area. In the pixel area, a plurality of photodiodes, pixel transistors, a plurality of color filters, and a plurality of micro lenses may be formed. In the logic area, a logic circuit and an input/output circuit may be formed. Heat generated in the logic area may be transferred to the pixel area to cause such flaws as dark current, white spots, or dark shading and increase resistance of interconnections.

SUMMARY

Embodiments of the present invention are directed to an image sensor having a logic area, a pixel area and guide dams for preventing heat which is generated in the logic area from reaching the pixel area.

Embodiments of the present invention are directed to a method for fabricating an image sensor having a logic area, a pixel area and guide dams for preventing heat which is generated in the logic area from reaching the pixel area.

In accordance with an embodiment of the present invention, an image sensor may include: a substrate including a pixel area, a logic area, and a guard area disposed between the pixel area and the logic area. The guard area may substantially prevent transfer of heat generated in the logic area from reaching the pixel area.

The guard area may include first and second guard dams. The first guard dam may be a heat insulator that blocks heat transfer. The second guard dam may be a heat conductor that guides any heat which passes through the first guard dam and reaches the second guard dam away from the pixel area to an image sensor opening.

The first guard dam and the second guard dam may have a shape of a frame surrounding the pixel area from a top view perspective.

The image first guard dam may be disposed closer to the logic area than the second guard dam.

The image sensor may further include: a surface dielectric layer disposed over a first side of the substrate; and an anti-reflective layer disposed over a second side of the substrate, wherein the first guard dam is formed to penetrate through the substrate between the surface dielectric layer and the anti-reflective layer.

The first guard dam may include a dielectric material formed inside a first guard trench which vertically penetrates through the substrate.

The second guard dam may vertically penetrate through the anti-reflective layer.

The second guard dam may include a conductive material formed inside a second guard trench which vertically penetrates through the substrate.

The second guard dam may include: a guard barrier metal layer that is conformally formed on the inner sidewall of the second guard trench; and a guard plug formed over the guard barrier metal layer.

The guard barrier metal layer may directly contact the substrate.

The image sensor may further include: a shield barrier metal layer formed over one surface of the substrate in the logic area, wherein the guard barrier metal layer is coupled to the shield barrier metal layer.

The image sensor may further include: a shield metal layer formed over the shield barrier metal layer, wherein the guard plug is coupled to the shield metal layer.

The image sensor may further include: a shield pattern formed over the shield metal layer. The shield pattern may include a polymer organic material which includes a blue pigment.

The image sensor may further include: an over-coating layer formed over the guard plug. The over-coating layer may have an opening that exposes part of a surface of the guard plug.

The image sensor may further include: a Through-Silicon Via (TSV) plug that penetrates through the substrate in the logic area; and a TSV barrier metal layer that surrounds the TSV plug, wherein the guard barrier metal layer and the TSV barrier metal layer include the same material, and the guard plug and the TSV plug include the same material.

The image sensor may further include: an inter-layer dielectric layer and multiple layers of metal interconnections that are formed over the substrate within the pixel area; and a dam pad formed within the guard area at the same level as one of the multiple layers of the metal interconnections. The second guard dam contacts with the dam pad.

In accordance with another embodiment of the present invention, an image sensor may include: a surface dielectric layer, a lower inter-layer dielectric layer, and an upper inter-layer dielectric layer that are formed over a first side of a substrate; an anti-reflective layer formed over a second side of the substrate; and a Through-Silicon Via (TSV), a first guard dam, and a second guard dam that penetrate through the substrate. The TSV may include a TSV barrier metal layer and a TSV plug that are formed inside a TSV hole which penetrates through the substrate and the anti-reflective layer. The first guard dam may include a dielectric material formed inside a first guard trench which is formed between the surface dielectric layer and the anti-reflective layer to vertically penetrate through the substrate. The second guard dam may penetrate through the substrate and the anti-reflective layer and may include a guard barrier metal layer and a guard plug.

The image sensor may further include: a shield metal layer that is formed over the anti-reflective layer; a shield pattern that is formed over the shield metal layer; and an over-coating layer that is formed over the shield metal layer and the shield pattern, wherein the over-coating layer includes a first opening that exposes a portion of a surface of the shield metal layer.

The image sensor may further include: a pad layer that is formed over the TSV plug. The over-coating layer may further include a second opening that exposes a portion of a surface of the pad layer.

In accordance with yet another embodiment of the present invention, an image sensor may include: a pixel area that includes photodiodes and a pixel transistor; a logic area that includes a logic transistor; a pad area that includes a TSV plug; and a guard area that is disposed between the pixel area and the logic area. The guard area may include an insulating first guard dam and a conductive second guard dam that form a shape of a frame which surrounds the pixel area, in terms of a top view.

The first guard dam may be disposed close to the logic area, and the second guard dam may be disposed close to the pixel area.

BRIEF DESCRIPTION OF THE DRAWINGS

These and other embodiments, features and advantages of the present invention will become apparent to those skilled in the art to which the present invention pertains from the following detailed description.

FIGS. 4A to 4L, 5A to 5G, and 6A to 6F are longitudinal cross-sectional views of image sensors taken along the line I-I' shown in FIG. 2 to describe methods for forming an image sensor in accordance with various embodiments of the present invention.

DETAILED DESCRIPTION

Figure 1:
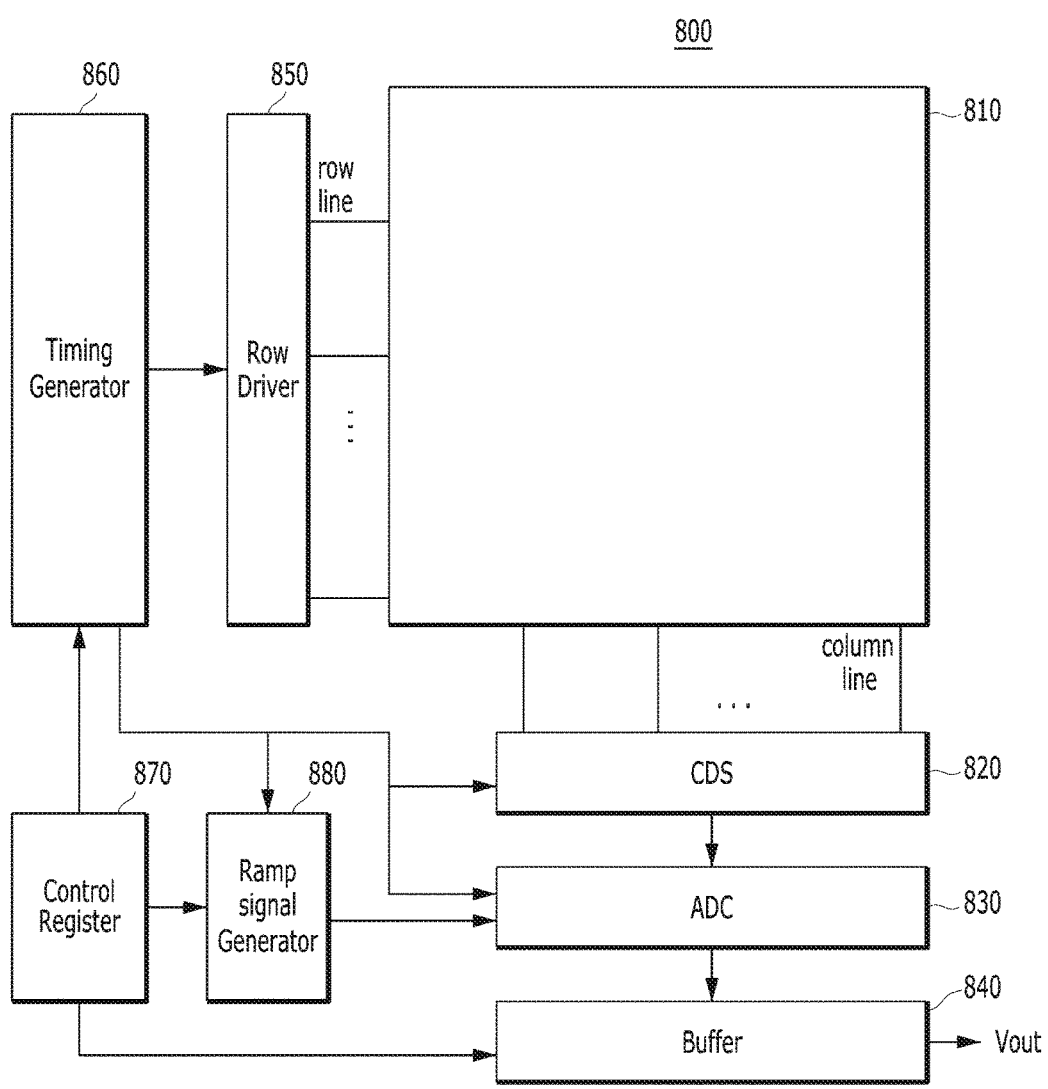
FIG. 1 is a block diagram illustrating an image sensor in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided to make this disclosure thorough and complete, and fully convey the present invention to those skilled in the art.

The terms used in this patent specification are for describing the embodiments of the present invention and they do not limit the scope of the present invention. In this specification, the use of a singular term includes a plural term as well unless mentioned otherwise. The use of an expression 'comprises' and/or 'comprising' a constituent element, step, and/or device in this patent specification does not exclude the presence or addition of another constituent element, step, and/or device.

When an element is described in this specification to be 'connected to' or 'coupled to' another element, the description includes not only a direct connection or coupling but also an indirect connection or coupling where yet another element is interposed between them. On the other hand, when an element is described to be 'directly connected to' or 'directly coupled to' another element, the description means that there are no other elements interposed between them. The expression 'and/or' means each of the mentioned items, and all combinations of one or more of the mentioned items.

When a first layer is referred to as being "on" a second layer or "on" a substrate, it not only refers to a case where the first layer is formed directly on the second layer or the substrate but also a case where a third layer exists between the first layer and the second layer or the substrate.

The terms 'below', 'beneath', 'lower', 'above', and 'upper' are spatially relative words, and they may be used to easily describe the correlation between an element or constituent element and another element or constituent element in the drawings. The spatially relative words have to be construed to include not only the direction illustrated in the drawings but also the different directions when the element is used or operates. For example, when a drawing is reversed, an element that is described to be 'below' or 'beneath' of another element may be disposed above the element.

Also, the embodiments of the present invention described in this specification are described with reference to the exemplary drawings which are cross-sectional views and/or plan views. The drawings are not necessarily to scale and in some instances, proportions may have been exaggerated in order to clearly illustrate features of the embodiments. Therefore, the forms of the exemplary drawings may be changed due to a fabrication method and/or tolerance. In this respect, the embodiments of the present invention are not limited to the specific forms illustrated in the drawings, but include a variation in the shape formed according to the fabrication process. For example, a region illustrated to have a right angle may be of a shape having a rounded portion or a predetermined curvature. Therefore, the regions shown in the drawings are roughly illustrated, and the shapes of the regions exemplarily illustrated in the drawings just show specific shapes of the regions of an element and they do not limit the scope of the present invention.

Throughout the disclosure, like reference numerals refer to like parts throughout the various figures and embodiments of the present invention. Therefore, the reference numerals may be referred to and described, although they are not mentioned and/or described in the corresponding drawing. Also, even though a reference numeral does not appear in the corresponding drawing, the constituent element of the reference numeral may be described by referring to other drawings.

FIG. 1 is a block diagram illustrating an image sensor 800 in accordance with an embodiment of the present invention.

Referring to FIG. 1, the image sensor 800 may include a pixel array 810, a correlated double sampler (CDS) 820, an analog-to-digital converter (ADC) 830, a buffer 840, a row driver 850, a timing generator 860, a control register 870, and a ramp signal generator 880.

The pixel array 810 may include a plurality of pixels (not shown) that are arrayed in a matrix structure. Each of the pixels may convert optical image data into electrical image signals and transfer the electrical image signals to the correlated double sampler 820 through column line. Each of the pixels may be coupled to one row line among a plurality of row lines and one column line among a plurality of column lines.

The correlated double sampler 820 may hold and sample the electrical image signals that are received from the pixels of the pixel array 810. For example, the correlated double sampler 820 may sample the voltage level of a received electrical image signal and a reference voltage level according to a clock signal provided by the timing generator 860, and transfer analog signals corresponding to the difference between the two voltage levels to the analog-to-digital converter 830.

The analog-to-digital converter 830 may convert the received analog signals into digital signals and transfer the digital signals to the buffer 840.

The buffer 840 may latch the received digital signals and sequentially output the digital signals Vout to an image signal processing unit (not shown). In an embodiment, the buffer 840 may include a memory for latching the digital signals, and a sense amplifier for amplifying the digital signals.

The row driver 850 may drive the pixels of the pixel array 810 according to a signal received from the timing generator 860. For example, the row driver 850 may generate a selection signal for selecting one row line among the plurality of row lines and/or a driving signal for driving one row line among the plurality of row lines.

The timing generator 860 may generate timing signals for controlling the correlated double sampler 820, the analog-to-digital converter 830, the row driver 850, and the ramp signal generator 880.

The control register 870 may generate control signals for controlling the buffer 840, the timing generator 860, and the ramp signal generator 880.

The ramp signal generator 880 may generate a ramp signal for controlling an image signal that is to be outputted from the analog-to-digital convertor 830 to the buffer 840 under the control of the timing generator 860.

Figure 2:
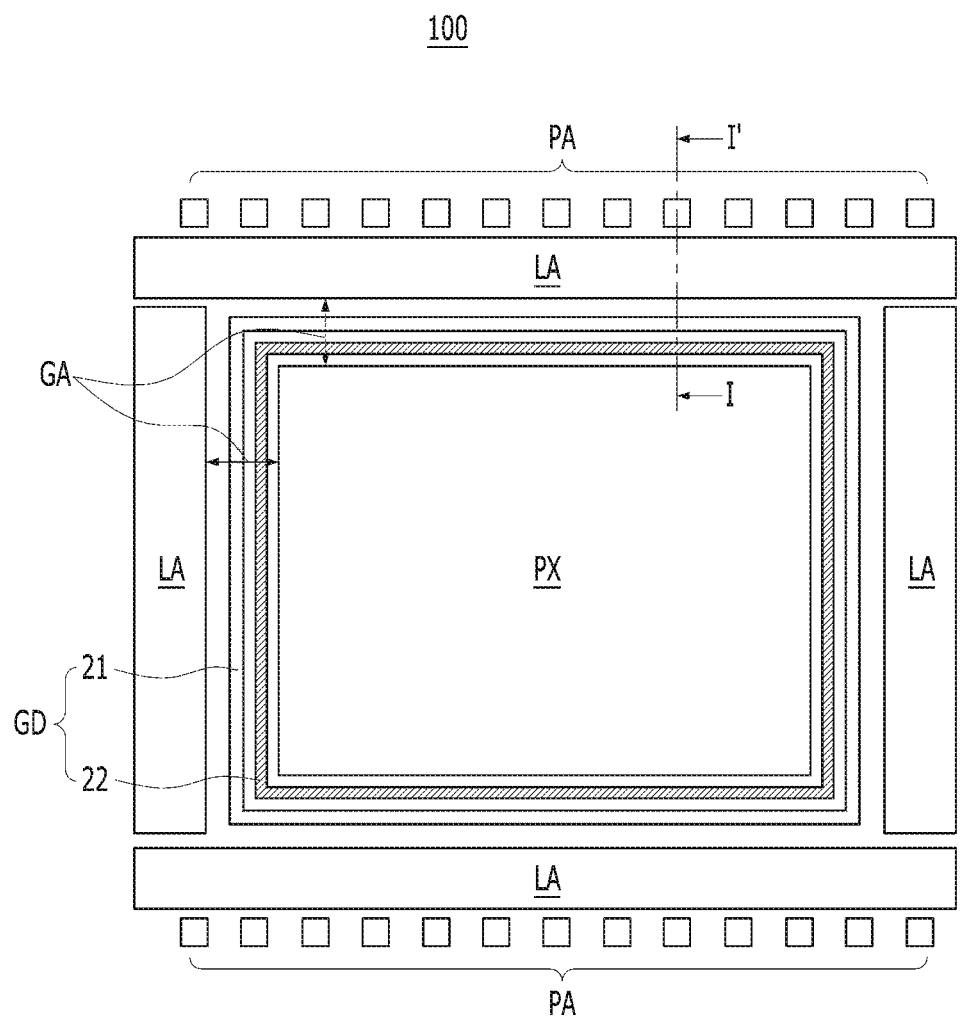
FIG. 2 is a block layout schematically illustrating an image sensor in accordance with an embodiment of the present invention.

FIG. 2 is a block layout schematically illustrating an image sensor 100 in accordance with an embodiment of the present invention.

Referring to FIG. 2, the image sensor 100 may include a pixel area PX at a central region, logic areas LA and pad areas PA on a peripheral region, and a guard area GA between the pixel area PX and the logic areas LA. In the illustrated embodiment of FIG. 2, there are four logic areas LA one on each side of the peripheral region and a plurality of pad areas PA arranged in a line on the top and bottom sides of the peripheral region next to the top and bottom logic areas LA, respectively. Each pad area PA has a small, square cross-sectional area. In the illustrated embodiment, there are 13 top side pad areas and 13 bottom side pad areas, however, the invention is not limited in this way. In some embodiments, the pad areas PA may be included in the logic areas LA. In other words, the pad areas PA may be part of the logic areas LA. Alternatively, the logic areas LA and the pad areas PA may be selectively omitted. For example, in an embodiment (not shown) logic areas LA may be included only in the left and right sides of the peripheral region, whereas the pad areas PA may be disposed on the top and bottom sides of the peripheral region adjacent to the guard area.

The pixel area PX may include pixels that may convert a plurality of beam lights into electrical signals. For example, the pixels may include photodiodes, color filters, microlenses, and pixel transistors.

The logic areas LA may include various logic circuits for processing the electrical signals received from the pixel area PX, such as a correlated double sampler (CDS) or an image processor.

The pad areas PA may include input/output pads for electrical connection between the logic areas LA and an external circuit and/or through-silicon vias (TSV).

The guard area GA may be formed to surround the pixel area PX. Hence, the guard area GA may be formed between the pixel area PX and the logic areas LA and/or between the pixel area PX and the pad areas PA to surround the pixel area PX. In the embodiment of FIG. 2, the guard area GA is formed between the four logic areas and the pixel area PX. In the inside of the guard area GA, one or more guard dams GD having a frame shape may be disposed.

The guard dams GD may include an outer guard dam 21 and an inner guard dam 22. The outer guard dam 21 may be disposed close to the logic areas LA, while the inner guard dam 22 is adjacent to the pixel area PX. The outer guard dam 21 and the inner guard dam 22 may extend in parallel with each other. The outer guard dam 21 and the inner guard dam 22 may be spaced apart from each other forming concentric rectangular frames.

The guard dams GD may prevent transfer heat, ions, or charges between the pixel area PX and the logic areas LA. In an embodiment, the guard dams GD may prevent heat transfer from the logic and pad areas LA and PA to the pixel area PX. In an embodiment, the outer guard dam 21 may block off the heat that is generated in the logic areas LA and the pad areas PA from being transferred to the pixel area PX, whereas the inner guard dam 22 may transfer the heat to the outside in order to prevent the heat from being transferred to the pixel area PX. The first guard dam may be formed or include a material having a lower thermal conductivity than the second guard material. In an embodiment, the first guard dam may be formed or include a heat insulator, whereas the second guard dam may be formed or include a heat conductor.

Figure 3A:
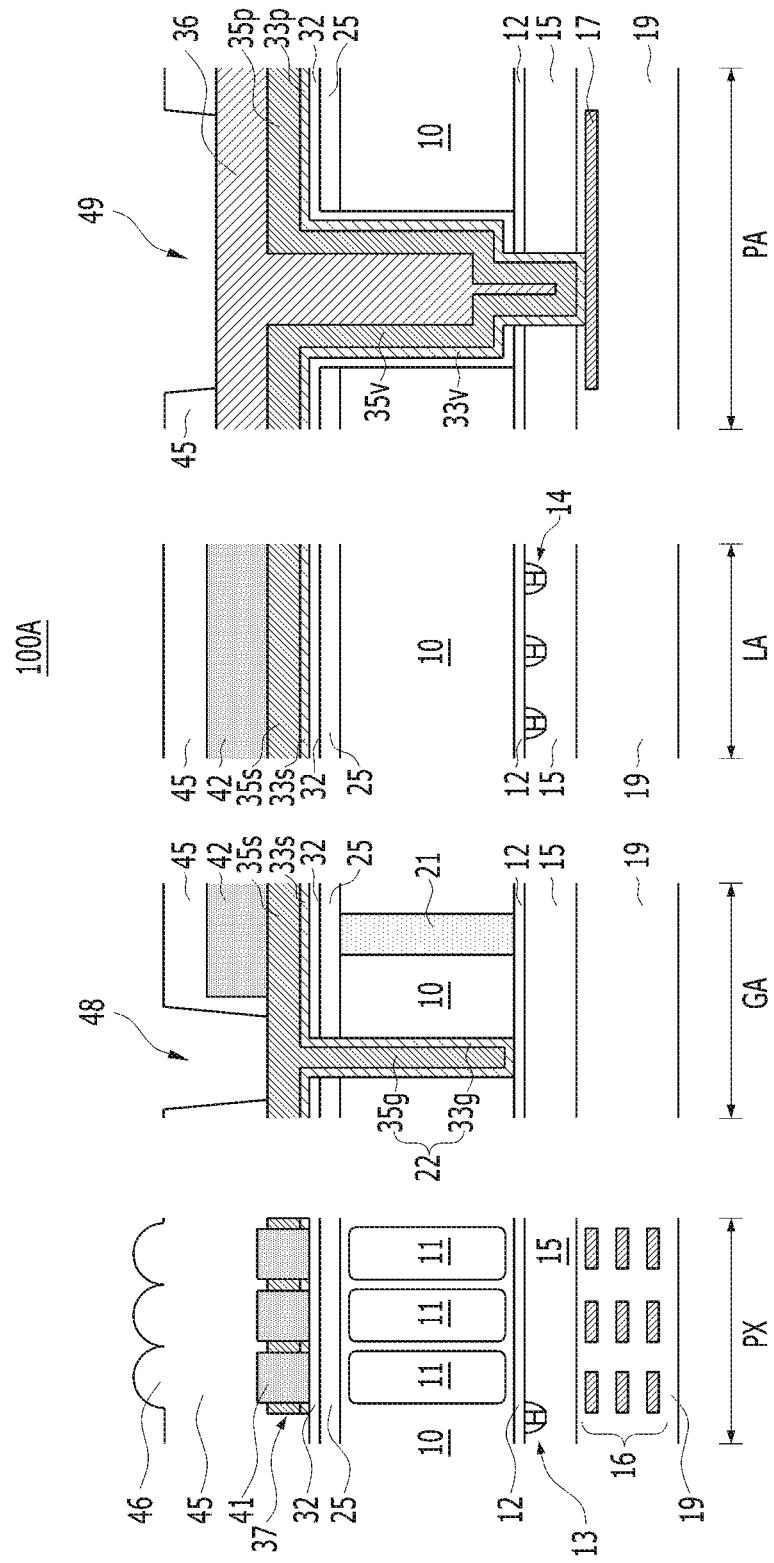
FIGS. 3A to 3C are longitudinal cross-sectional views of image sensors in accordance with various embodiments of the present invention taken along the line I-I' shown in FIG. 2.
Figure 3B:
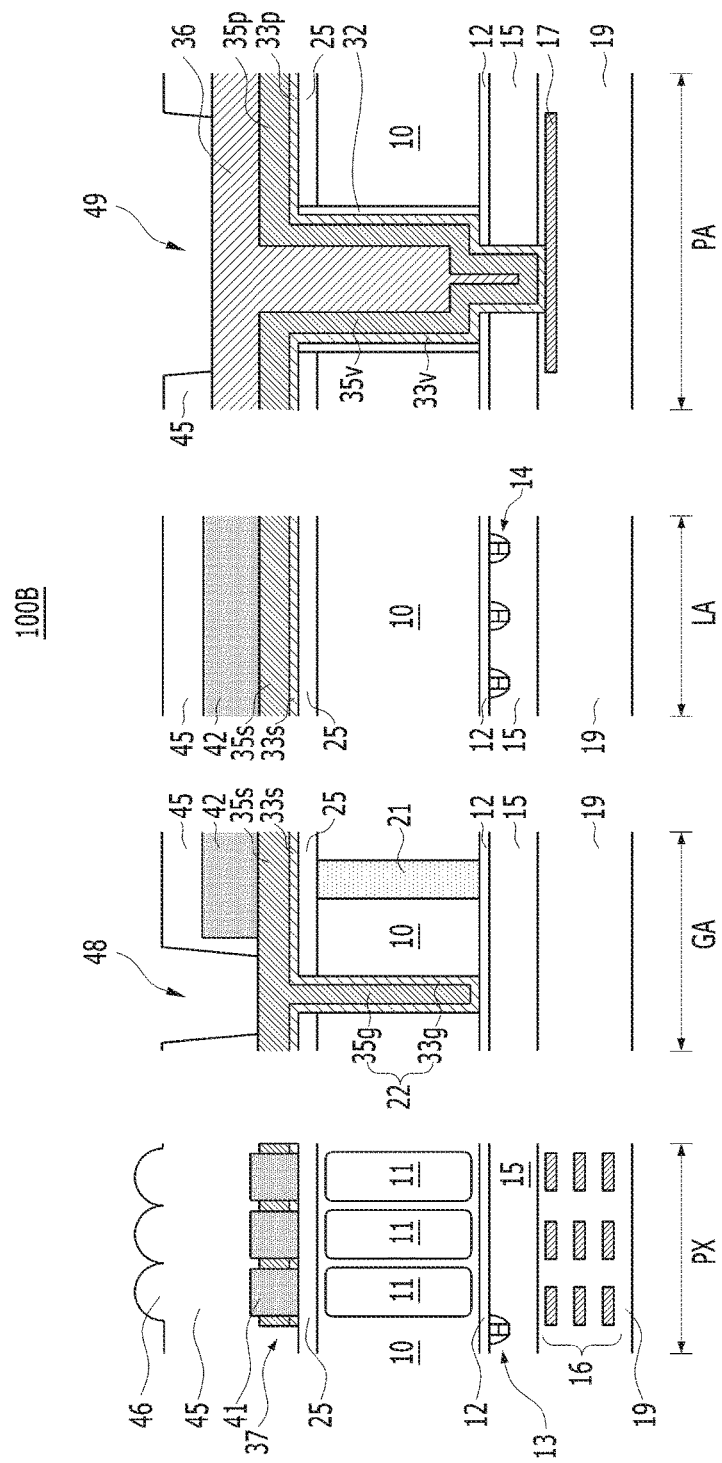
Figure 3C:
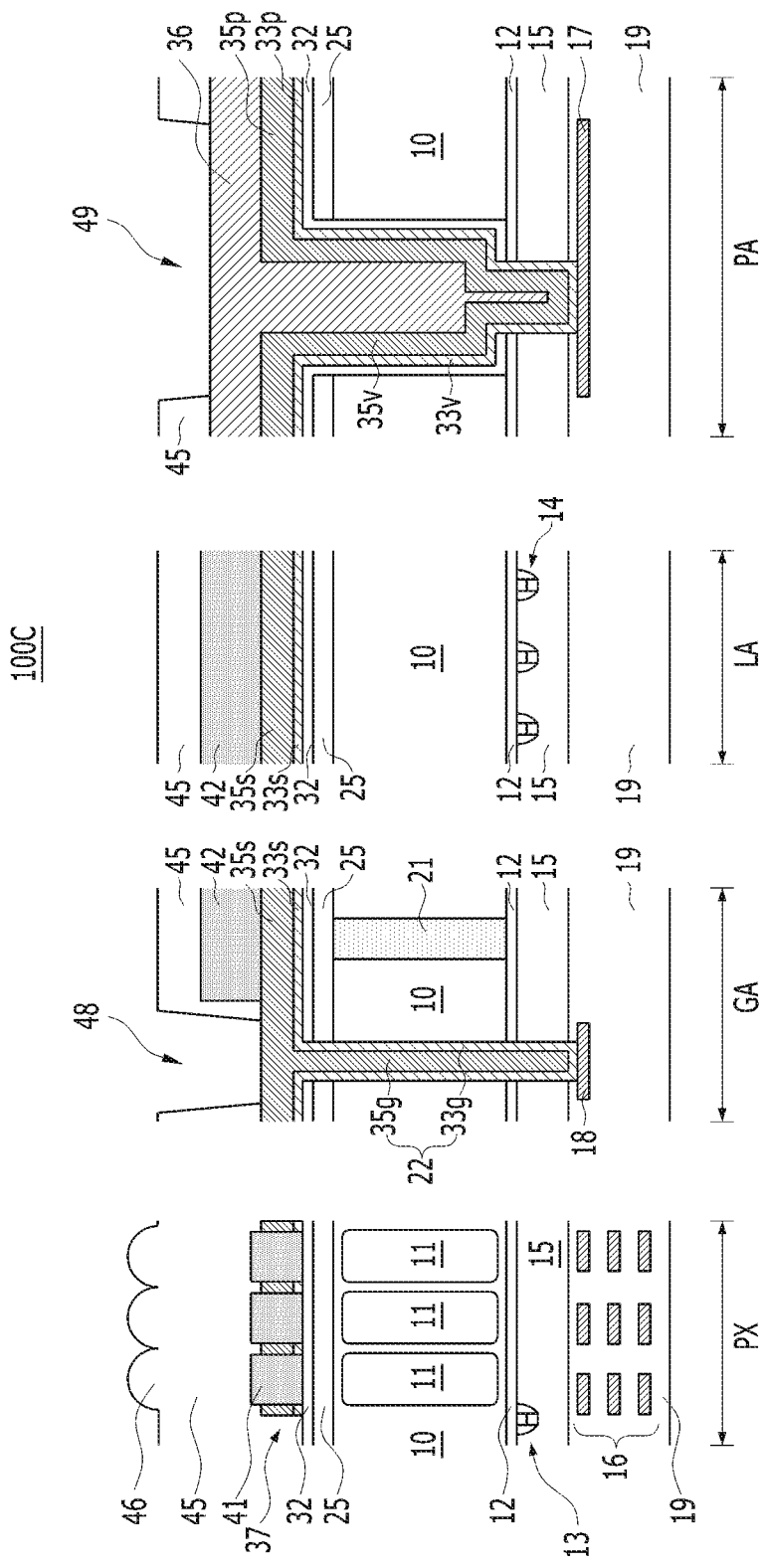

FIGS. 3A to 3C are longitudinal cross-sectional views of image sensors 100A, 100B and 100C in accordance with various embodiments of the present invention taken along the line I-I' shown in FIG. 2.

Referring to FIG. 3A, the image sensor 100A may include a pixel area PX, a guard area GA, a logic area LA, and a pad area PA. In some embodiments, as shown in FIG. 2, the pixel area PX may be disposed at the central region, and the logic area LA and the pad area PA may be disposed on the peripheral region of the pixel area PX, while the guard area GA disposed between the pixel area PX and the logic area LA.

Within the pixel area PX, the image sensor 100A may include photodiodes 11 that are formed in a substrate 10, a surface dielectric layer 12, a pixel transistor 13, a lower inter-layer dielectric layer 15, multiple layers of metal interconnections 16 and an upper inter-layer dielectric layer 19 that are formed over a first side of the substrate 10, e.g., a front side of the substrate 10. Further, the image sensor 100A may include an anti-reflective layer 25, a lining layer 32, pixel grids 37, color filters 41, an over-coating layer 45 and micro lenses 46 that are formed over a second side of the substrate 10, e.g., a back side of the substrate 10.

The surface dielectric layer 12 may have an etch selectivity with respect to the substrate 10 and the lower inter-layer dielectric layer 15. For example, the substrate 10 may be formed of or include silicon, and the surface dielectric layer 12 may be formed of or include a silicon nitride, a silicon oxide, a silicon oxynitride or a combination thereof.

The pixel transistor 13 may be at least one of a transfer transistor, a reset transistor, a selection transistor, or an amplification transistor.

The lower inter-layer dielectric layer 15 may be formed over the surface dielectric layer 12 to cover the pixel transistor 13, and the upper inter-layer dielectric layer 19 may be formed over the lower inter-layer dielectric layer 15 to cover the multiple layers of metal interconnections 16. For example, the lower inter-layer dielectric layer 15 and the upper inter-layer dielectric layer 19 may be formed of or include a silicon oxide.

The multiple layers of metal interconnections 16 may be formed of or include a metal, and may transfer electrical signals, for example, in a horizontal direction.

The anti-reflective layer 25 may be formed of or include a silicon nitride, a silicon oxide, a silicon oxynitride or a combination thereof.

The lining layer 32 may be formed of or include a dielectric material, such as a silicon oxide or a silicon nitride. In another embodiment, the lining layer 32 may be omitted from the pixel area PX.

The pixel grids 37 may have a lattice form to define the boundaries of the color filters 41, from a top view perspective. The pixel grids 37 may be arrayed perpendicularly to the photodiodes 11 and may be spaced apart along the horizontal direction at a regular interval. The pixel grids 37 may be formed of or include a lower metal and an upper metal. Non-limiting examples of suitable lower metals may include barrier metals, such as titanium (Ti), a titanium nitride (TiN), tantalum (Ta), a tantalum nitride (TaN), and a tungsten nitride (WN). Non-limiting examples of suitable upper metals may include a metal such as tungsten (W).

The color filters 41 may be disposed at the intervals formed between the pixel grids 37. The color filters may be formed of or include a polymer organic material including a red pigment, a polymer organic material including a green pigment, and a polymer organic material including a blue pigment.

The over-coating layer 45 and the micro lenses 46 may be made of or include any suitable polymer organic material. In an embodiment, the over-coating layer 45 and the micro lenses 46 may be made of or include the same polymer organic material. According to another embodiment, the over-coating layer 45 may be omitted from the pixel area PX.

Within the guard area GA, the image sensor 100A may include the substrate 10, the surface dielectric layer 12, the lower inter-layer dielectric layer 15, and an upper inter-layer dielectric layer 19. Further, the image sensor 100A may include an outer guard dam 21 and an inner guard dam 22 that are formed in the inside of the substrate 10 to vertically penetrate through the substrate 10, a shield barrier metal layer 33s and a shield metal layer 35s, a shield pattern 42, and the over-coating layer 45 that are disposed over the anti-reflective layer 25 and the lining layer 32.

The outer guard dam 21 and the inner guard dam 22 may have a form of wall in the longitudinal cross-sectional views, but they may have a form of a frame which encloses the pixel area PX in a top view or a plan view. The outer guard dam 21 may be formed of or include a dielectric material having a low heat transmission rate, such as a silicon oxide. The outer guard dam 21 may be formed to penetrate through the substrate 10 between the surface dielectric layer 12 and the anti-reflective layer 25. Since the outer guard dam 21 is a dielectric material, it may effectively block heat transfer through the substrate 10.

The inner guard dam 22 may include a guard barrier metal layer 33g and a guard plug 35g. The guard barrier metal layer 33g may vertically penetrate through the anti-reflective layer 25, the lining layer 32, and the substrate 10, and it may be horizontally extended onto the surface of the lining layer 32 over the second side of the substrate 10 to be coupled to the shield barrier metal layer 33s. The guard barrier metal layer 33g and the shield barrier metal layer 33s may be formed to include the same material so as to form a physical continuum of a single body. The guard plug 35g may be formed to be vertically extended onto the guard barrier metal layer 33g, and it may be extended onto the shield barrier metal layer 33s to be coupled to the shield metal layer 35s. The guard plug 35g and the shield metal layer 35s may be formed to include the same material so as to form a physical continuum of a single body. The inner guard dam 22 is a conductor so that the heat from inside of the substrate 10 may be transferred outside effectively.

The shield pattern 42 may be formed over the shield metal layer 35s to be arranged perpendicularly to the outer guard dam 21. The shield pattern 42 may include a polymer organic material including a blue pigment for preventing light from entering the shield metal layer 35s and from being reflected from the shield metal layer 35s. According to another embodiment, the shield pattern 42 may include a lower shield and an upper shield. The lower shield may have the same structure as that of the color filters 41. For example, the lower shield may include a polymer organic material including a red pigment, a polymer organic material including a green pigment, and a polymer organic material including a blue pigment. The upper shield may be formed widely over the lower shield. The upper shield may include a polymer organic material including a blue pigment.

The over-coating layer 45 may be formed over the shield metal layer 35s and the shield pattern 42. The over-coating layer 45 may include a polymer organic material. The over-coating layer 45 may include the same material as the micro lenses 46. The over-coating layer 45 may include a heat-emitting opening 48 that is aligned vertically with the inner guard dam 22. Therefore, the heat conducted through the inner guard dam 22 may be effectively emitted through the heat-emitting opening 48. According to another embodiment, the heat-emitting opening 48 may not be in vertical alignment with the inner guard dam 22, or the heat-emitting opening 48 may be omitted.

Within the logic area LA, the image sensor 100A may include the substrate 10, the surface dielectric layer 12, a logic transistor 14 formed over the surface dielectric layer 12 in the first side (e.g., the front side) of the substrate 10, the lower inter-layer dielectric layer 15 and the upper inter-layer dielectric layer 19. Further, the image sensor 100A may include the anti-reflective layer 25, the lining layer 32, the shield barrier metal layer 33s, the shield metal layer 35s, the shield pattern 42, and the over-coating layer 45 that are formed over the second side (e.g., the back side) of the substrate 10. The logic transistor 14 may be part of a logic circuit or an image processing circuit (not shown). The anti-reflective layer 25, the lining layer 32, the shield barrier metal layer 33s, the shield metal layer 35s, the shield pattern 42, and the over-coating layer 45 may be horizontally extended from the guard area GA to cover most of the logic area LA.

Within the pad area PA, the image sensor 100A may include the substrate 10, the surface dielectric layer 12, the lower inter-layer dielectric layer 15 and the upper inter-layer dielectric layer 19. Also, the image sensor 100A may include the lining layer 32, a through-silicon via (TSV) barrier metal layer 33v, and a TSV plug 35v that penetrate through the substrate 10. Further, the image sensor 100A may include a via pad 17 in the upper inter-layer dielectric layer 19 over the first side (e.g., the front side) of the substrate 10. In addition, the image sensor 100A may include the anti-reflective layer 25, the lining layer 32, a pad barrier metal layer 33p, a lower pad layer 35p, an upper pad layer 36, and the over-coating layer 45 over the second side (e.g., the back side) of the substrate 10.

The via pad 17 may be disposed at the same level as one among the multiple layers of metal interconnections 16. The via pad 17 may be formed of or include the same metal as the multiple layers of metal interconnections 16. The TSV barrier metal layer 33v may surround the sides and bottom surface of the TSV plug 35v. The TSV barrier metal layer 33v may contact the via pad 17. The lining layer 32 may conformally surround the sides and bottom surface of the TSV barrier metal layer 33v to separate the TSV barrier metal layer 33v from the substrate 10 and a lower surface of the dielectric layer 12. The lower surface of the dielectric layer 12 is the surface that abuts the substrate 10.

The TSV barrier metal layer 33v and the TSV plug 35v may completely penetrate through the substrate 10, the surface dielectric layer 12, and the lower inter-layer dielectric layer 15, and partially penetrate through the upper inter-layer dielectric layer 19. For example, the TSV barrier metal layer 33v and the TSV plug 35v may have a two-stage cylindrical shape. The upper stage of the TSV barrier metal layer 33v and the TSV plug 35v may penetrate the surface dielectric layer 12, the lower inter-layer dielectric layer 15 and partly penetrate the upper inter-layer dielectric layer 19, and have a smaller diameter than the lower stage that penetrates the substrate 10 and the anti-reflective layer 25.

The TSV barrier metal layer 33v may be extended onto the lining layer 32 which lies over the anti-reflective layer 25 to be coupled to the pad barrier metal layer 33p. In other words, the TSV barrier metal layer 33v and the pad barrier metal layer 33p may be formed of or include the same material to form a physical continuum of a single body. In another embodiment, the pad barrier metal layer 33p may be coupled to the shield barrier metal layer 33s. In other words, the pad barrier metal layer 33p and the shield barrier metal layer 33s may include the same material to form a physical continuum of a single body.

The TSV plug 35v may be extended onto the pad barrier metal layer 33p to be coupled to the lower pad layer 35p. In other words, the TSV plug 35v and the lower pad layer 35p may include the same material to form a physical continuum of a single body.

The upper pad layer 36 may be formed over the lower pad layer 35p and may conform to the shape of the internal surface of the TSV plug 35v, hence the upper pad layer 36 may penetrate through the lower pad layer 35p, the pad barrier metal layer 33p, the lining layer 32, the anti-reflective layer 25, the substrate 10, the surface dielectric layer 12, and partly penetrate the lower inter-layer dielectric layer 15. Hence, the upper pad layer 36 may be considered as an inner TSV plug and the TSV plug 35v may be considered as an outer TSV plug.

The over-coating layer 45 in the pad area PA is formed over the upper pad layer 36 and may include a pad opening 49 which exposes a part of the surface of the upper pad layer 36.

Referring to FIG. 3B, the image sensor 100B in accordance with another embodiment of the present invention may not include the lining layer 32 formed over the anti-reflective layer 25 over the second side, e.g., the back side, of the substrate 10, of the image sensor 100A illustrated in FIG. 3A. In the image sensor 100B, the lining layer 32 may be formed only over the side of the TSV barrier metal layer 33v within the pad area PA that penetrates the anti-reflective layer 25 and the substrate 10.

Referring to FIG. 3C, an image sensor 100C is provided in accordance with yet another embodiment of the present invention. The image sensor 100C may further include a dam pad 18 formed in the upper inter-layer dielectric layer 19 within the guard area GA, as compared to the image sensor 100A illustrated in FIG. 3A. Also, unlike the image sensor 100A, the inner guard dam 22 of the image sensor 100C completely penetrates through the surface dielectric layer 12 and the lower inter-layer dielectric layer 15 and partially penetrates through the upper inter-layer dielectric layer 19 to contact the dam pad 18.

FIGS. 4A to 4L are longitudinal cross-sectional views of image sensors taken along the line I-I' shown in FIG. 2 to describe a method for forming an image sensor 100A of FIG. 3A in accordance with an embodiment of the present invention.

Figure 4A:
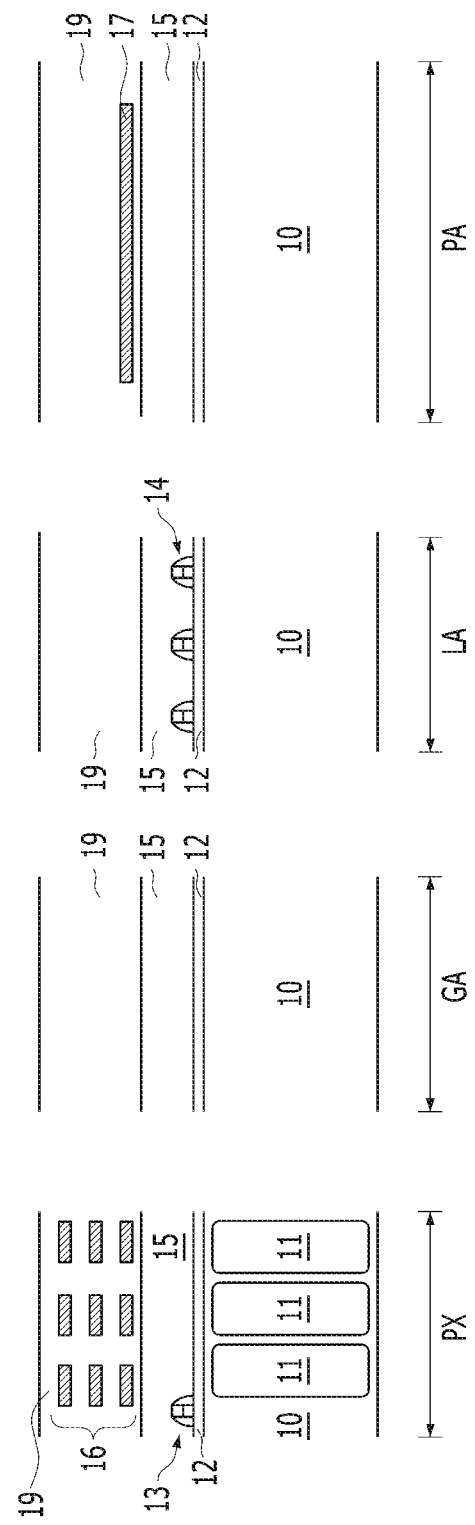

Referring to FIG. 4A, the method for forming an image sensor 100A may include: preparing a substrate 10 which includes a pixel area PX, a guard area GA, a logic area LA, and a pad area PA; forming photodiodes 11 in the substrate 10 in the pixel area PX; forming a surface dielectric layer 12 on the substrate over a first side (e.g., a front side) of the substrate 10; forming a pixel transistor 13 in the pixel area PX and a logic transistor 14 in the logic area LA, the pixel transistor 13 and the logic transistor 14 being formed over the surface dielectric layer 12; forming a lower inter-layer dielectric layer 15 extending over the surface dielectric layer 12 in all of the pixel, guard, logic and pad areas PX, GA, LA, and PA; forming an upper inter-layer dielectric layer 19 extending over the lower inter-layer dielectric layer 15 in all of the pixel, guard, logic and pad areas PX, GA, LA, and PA; and forming multiple layers of metal interconnections 16 spaced apart at regular intervals in the pixel area PX and a via pad 17 in the pad area PA inside the upper inter-layer dielectric layer 19. The multiple layers of metal interconnections 16 in the pixel area PX and a via pad 17 in the pad area PA are fully disposed within the upper inter-layer dielectric layer 19. In the embodiment of FIG. 4A it is shown that three photodiodes 11, one pixel transistor 13, and three logic transistors 14 are formed, however, we note that the invention is not limited in this way, and that in other embodiments a different number of these elements may be formed based on design. Also, as shown in FIG. 4A, the thickness of the lower inter-layer dielectric layer 15 may be sufficient to fully cover the pixel and logic transistors 13 and 14. Also, as illustrated in FIG. 4A, three layers of metal interconnections 16 are formed spaced apart at a regular interval along the vertical direction in the pixel area PX fully disposed inside the upper inter-layer dielectric layer 19, and each layer has three regions spaced apart at a regular interval along the horizontal direction resulting in a total of nine metal interconnections. It is understood that the configuration and number of these metal interconnections may be changed according to design. Moreover, as further shown in FIG. 4A, only one via pad 17 is formed in the pad area PA at the same level as the first layer of the three layers of metal interconnections 16, however, it is noted that the invention is not limited in this way. It is understood that the via pad 17 may be formed at the same level of any of the layers of the metal interconnections 16. Also, it is understood that one or more via pads 17 may be formed as may be needed based on design. The substrate 10 may include a single crystalline semiconductor wafer such as a silicon wafer, an epitaxially grown single crystalline semiconductor layer such as an epitaxially grown single crystalline silicon layer, or one among other single crystalline semiconductor layers such as single crystalline silicon layers.

The photodiodes 11 may be formed by performing an ion implantation process for implanting n-type ions and p-type ions into the substrate 10.

The surface dielectric layer 12 may be formed by performing a deposition process. The surface dielectric layer 12 may have an etch selectivity with respect to the substrate 10. For example, the surface dielectric layer 12 may include a silicon oxide, a silicon nitride, a silicon oxynitride or a combination thereof. For example, the surface dielectric layer 12 may be formed over the profile of the pixel area PX, the guard area GA, the logic area LA, and the pad area PA.

The lower inter-layer dielectric layer 15 and the upper inter-layer dielectric layer 19 may include a silicon oxide, a silicon nitride, a silicon oxynitride, or a combination thereof formed by performing a deposition process.

The multiple layers of metal interconnections 16 and the via pad 17 may be formed in the upper inter-layer dielectric layer 19 by performing a deposition process, a photolithography process, and an etch process. The via pad 17 may be formed at the same level as any of the multiple layers of metal interconnections 16. The multiple layers of metal interconnections 16 and the via pad 17 may include the same metal, such as tungsten (W).

Referring to FIG. 4B, the method may further include forming an outer guard trench 21T by turning the substrate 10 upside down, forming a first mask pattern M1 over a second side (e.g., a back side) of the substrate 10, and performing a first etch process using the first mask pattern M1 as an etch mask. The first mask pattern M1 may include a photoresist, a hard mask, or a combination thereof. The hard mask may include a silicon nitride, a silicon oxide, a silicon oxynitride or a combination thereof. The first etch process may include a process of etching the substrate 10. For example, the first etch process may include a process of etching silicon. The outer guard trench 21T may vertically penetrate through the substrate 10 to expose the surface dielectric layer 12. The outer guard trench 21T may have a shape of a narrow elongated trench that is extended along in the vertical direction in a longitudinal cross-sectional view, and may have a shape of a frame from a top view perspective or a plan view. Subsequently, the first mask pattern M1 may be removed.

Figure 4C:
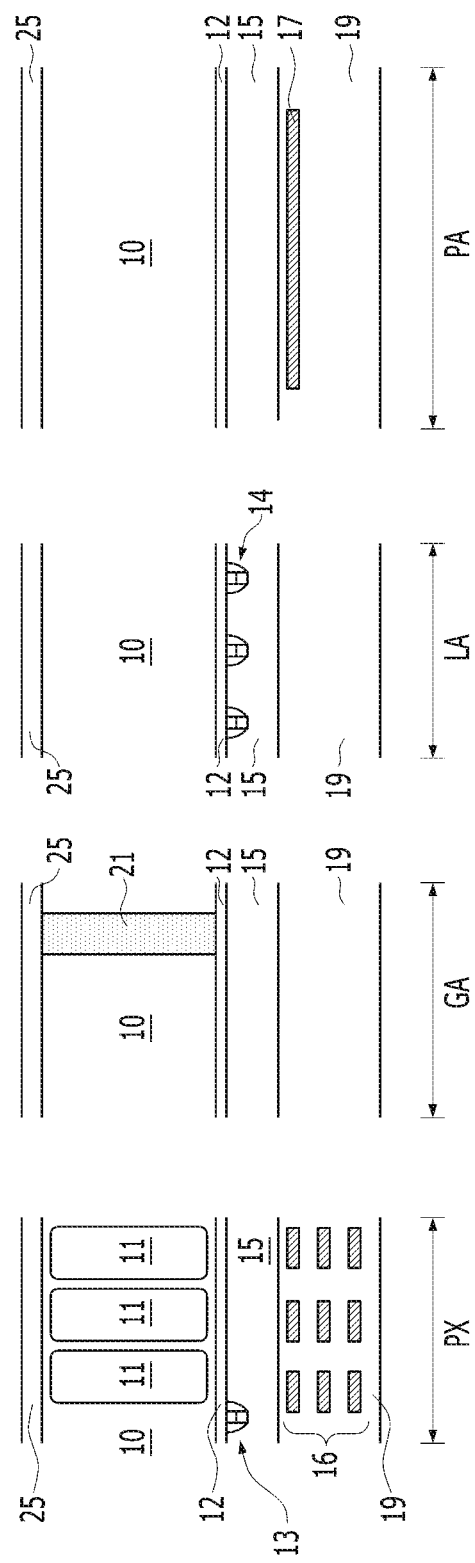

Referring to FIG. 4C, the method may further include forming an outer guard dam 21 by filling the outer guard trench 21T with a dielectric material, such as a silicon oxide, performing a planarization process any excess dielectric material from the exposed surface of the outer guard trench 21T, and forming an anti-reflective layer 25 over the profile of the second side (e.g., the back side) of the substrate 10 to cover the outer guard dam 21. The planarization process may be any suitable planarization process such as, for example, a Chemical Mechanical Polishing (CMP) process. The anti-reflective layer 25 may include a silicon nitride, a silicon oxide, a silicon oxynitride or a combination thereof. As shown in FIG. 2, the outer guard dam 21 may have a form of a vertical wall in a longitudinal cross-sectional view, and a shape of a frame surrounding the pixel area PX, from a top view perspective or a plan view.

Figure 4D:
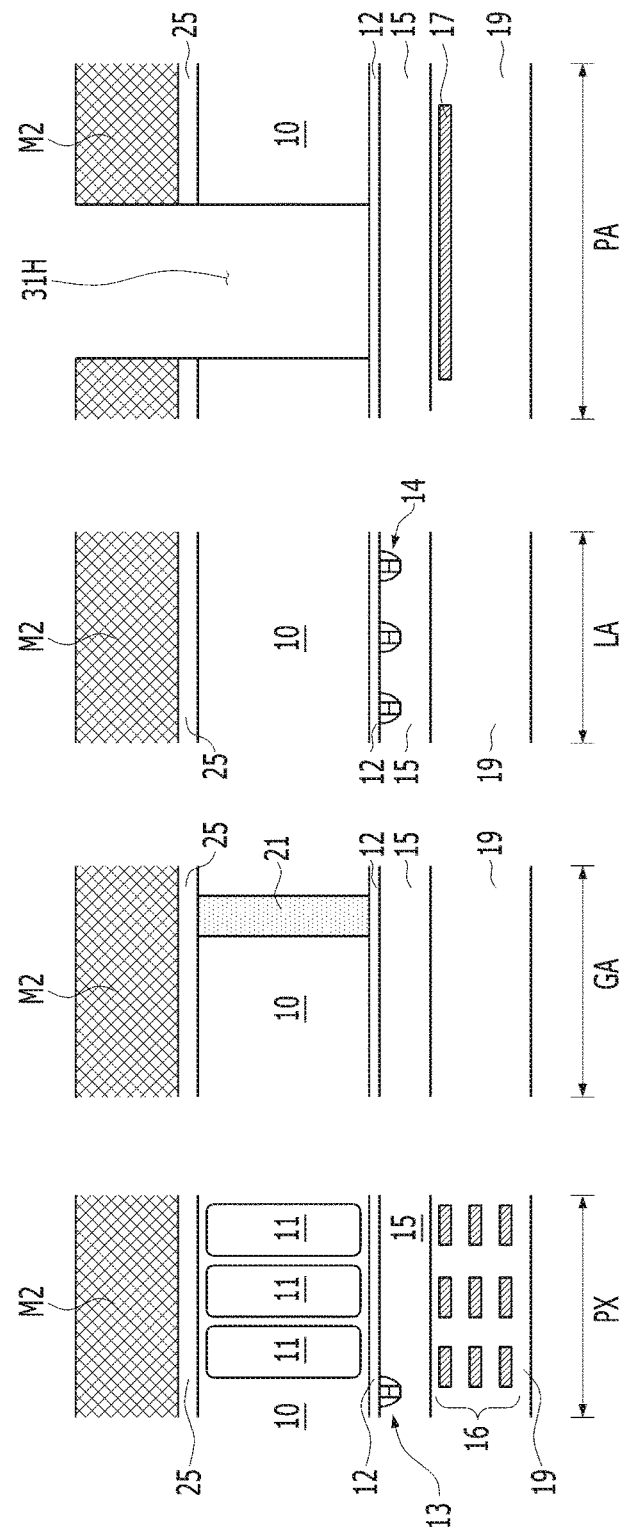

Referring to FIG. 4D, the method may further include forming a second mask pattern M2 over the anti-reflective layer 25, and performing a second etch process using the second mask pattern M2 as an etch mask so as to form an upper TSV hole 31H. The second etch process using the mask pattern M2 may include a process of etching the anti-reflective layer 25 and a process of etching the substrate 10. The surface dielectric layer 12 may be exposed at the bottom of the upper TSV hole 31H. The upper TSV hole 31H may have a hollow pillar shape in a longitudinal cross-sectional view, and the upper TSV hole 31H may have a circle or a polygonal shape from a top view perspective or a plan view. A polygonal shape as used herein may include a shape having three, four, five or more sides. Subsequently, the second mask pattern M2 may be removed.

Figure 4E:
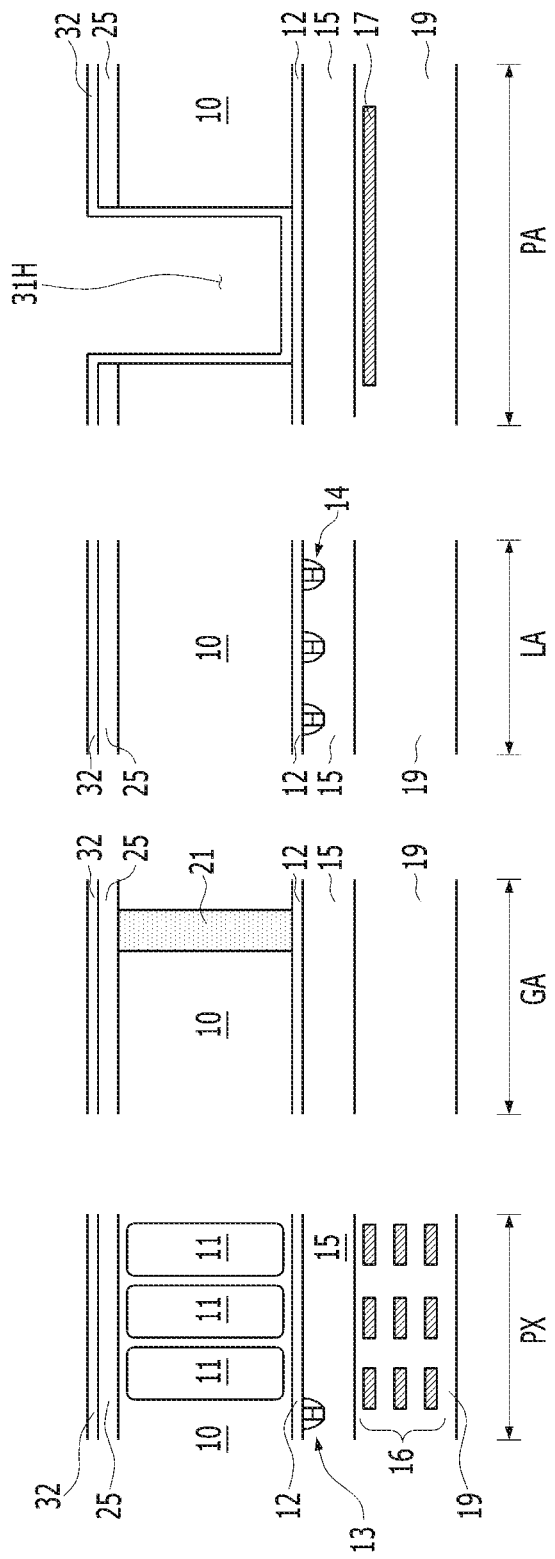

Referring to FIG. 4E, the method may further include forming a lining layer 32 conformally on the surface of the anti-reflective layer 25, the inner sidewall surface of the upper TSV hole 31H and the bottom surface of the upper TSV hole 31H which is exposed to the surface dielectric layer 12. In an embodiment, the lining layer 32 may have a cylindrical shape in the inside of the TSV hole 31H. The lining layer 32 may be formed over the profile of the anti-reflective layer 25 in all of the pixel, guard, logic and pad areas PX, GA, LA, and PA. The lining layer 32 may be formed of or include a silicon nitride or a silicon oxide such as Tetra-Ethyl-Ortho-Silicate (TEOS).

Referring to FIG. 4F, the method may further include forming a third mask pattern M3 over the lining layer 32, in all of the pixel, guard, logic and pad areas PX, GA, LA and PA, and performing a third etch process using the third mask pattern M3 as an etch mask so as to form an inner guard trench 22T. The third mask pattern M3, too, may include a photoresist, a hard mask, or a combination thereof. The third mask pattern M3 may fill the upper TSV hole 31H. The third etch process may include a process of etching the lining layer 32, a process of etching the anti-reflective layer 25, and a process of etching the substrate 10. The surface dielectric layer 12 may be exposed at the bottom surface of the inner guard trench 22T. Subsequently, the third mask pattern M3 may be removed.

Figure 4G:
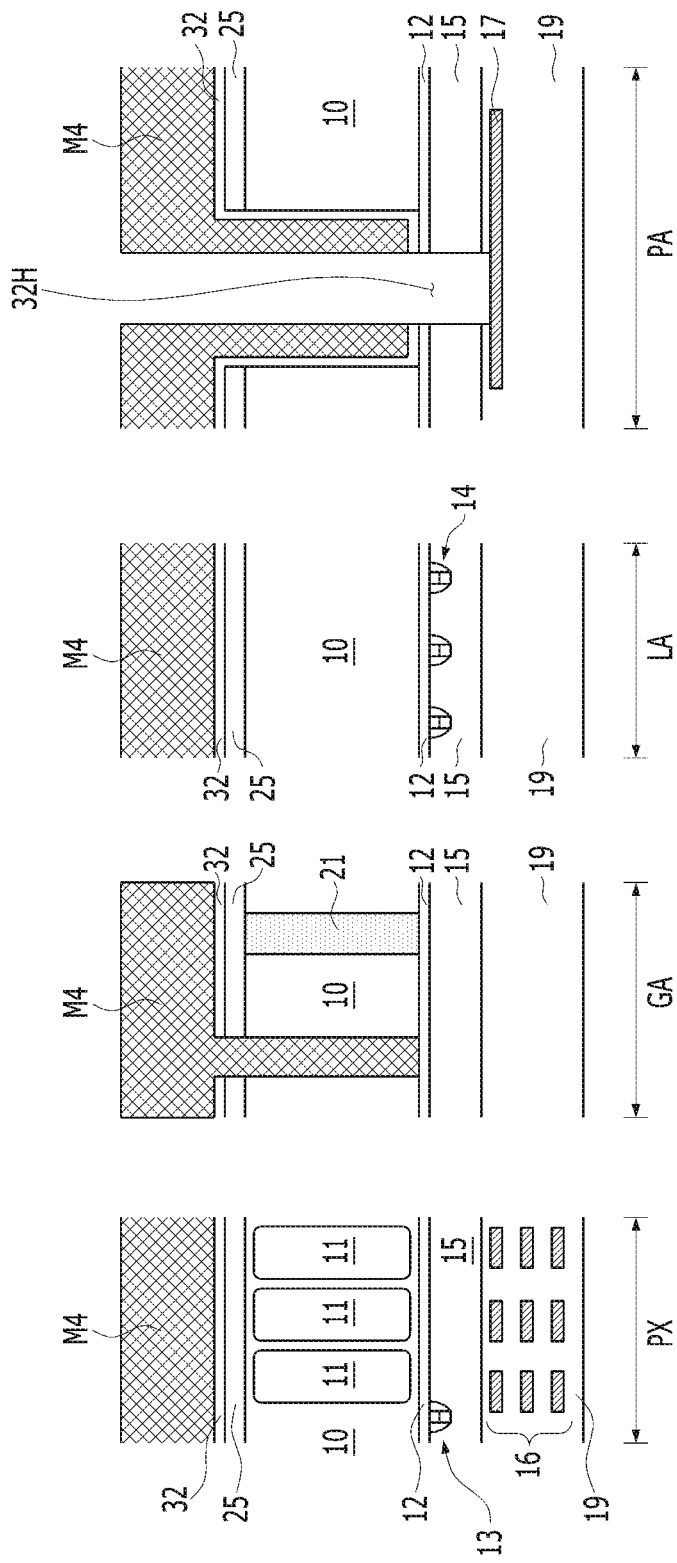

Referring to FIG. 4G, the method may further include forming a fourth mask pattern M4 over the lining layer 32 in all of the pixel, guard, logic, and pad areas PX, GA, LA, and PA, and performing a fourth etch process using the fourth mask pattern M4 as an etch mask so as to form a lower TSV hole 32H in the pad area PA. The fourth mask pattern M4, too, may include a photoresist, a hard mask, or a combination thereof. The fourth mask pattern M4 may also fill the inner guard trench 22T. The fourth mask pattern M4 may also fill part of the upper TSV hole 31H. The fourth etch process may include a process of etching the lining layer 32, a process of etching the surface dielectric layer 12, and a process of etching the lower inter-layer dielectric layer 15 and partly etching the upper inter-layer dielectric layer 19. The via pad 17 may be exposed at the bottom surface of the lower TSV hole 32H. Subsequently, the fourth mask pattern M4 may be removed.

Figure 4H:
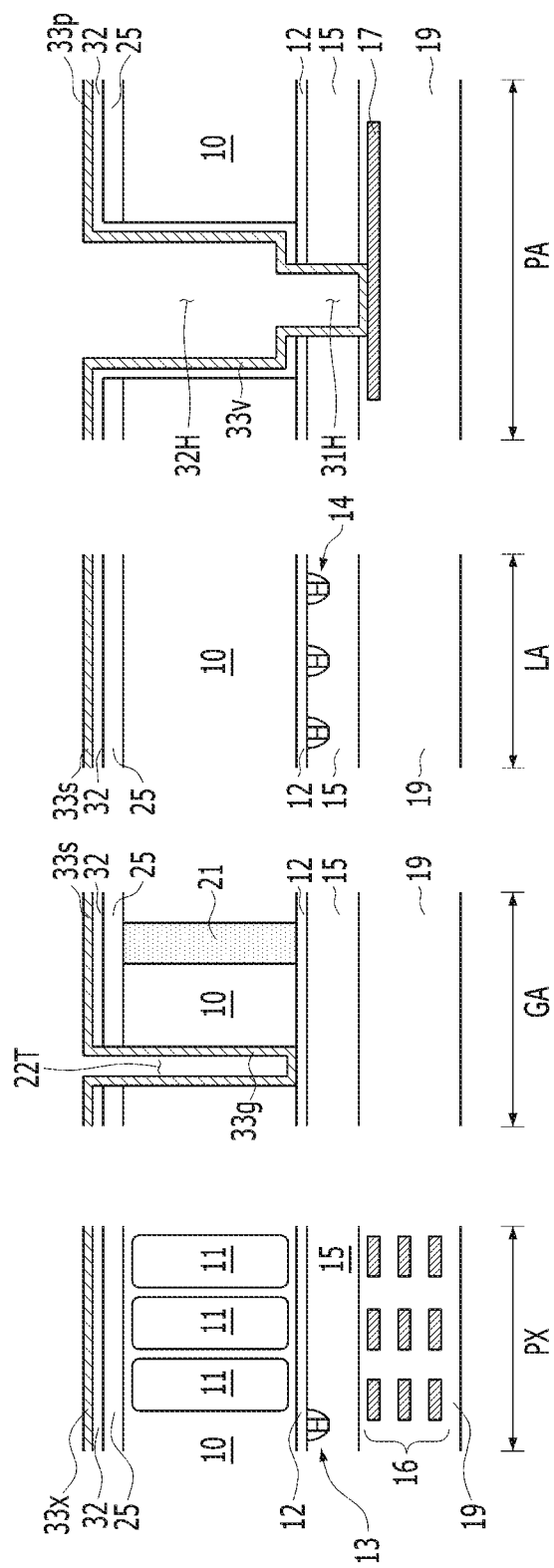

Referring to FIG. 4H, the method may further include conformally forming barrier metal layers 33$x$, 33$g$, 33$s$, 33$v$ and 33$p$ over the inner guard trench 22T and the inner sidewalls and bottom surfaces of the TSV holes 31H and 32H. More specifically, the barrier metal layers 33$x$, 33$g$, 33$s$, 33$v$ and 33$p$ may include a pixel barrier metal layer 33$x$ over the lining layer 32 of the pixel area PX, a guard barrier metal layer 33$g$ on the inner sidewalls and bottom surfaces of the inner guard trenches 22T, a shield barrier metal layer 33$s$ over the lining layer 32 of the guard area GA (which vertically overlaps the outer guard dam 21) and the lining layer 32 of the logic area LA, a TSV barrier metal layer 33$v$ on the inner sidewalls and bottom surfaces of the upper TSV holes 31H and the lower TSV holes 32H, and a pad barrier metal layer 33$p$ over the lining layer 32 of the pad area PA. The barrier metal layers 33$x$, 33$g$, 33$s$, 33$v$ and 33$p$ may include the same material and may form a physical continuum. In other words, the barrier metal layers 33x, 33g, 33s, 33v and 33p may form a single body. For example, the barrier metal layers 33x, 33g, 33s, 33v and 33p may include a barrier metal, such as titanium (Ti), a titanium nitride (TiN), tantalum (Ta), a tantalum nitride (TaN), and a tungsten nitride (WN). The TSV barrier metal layer 33v may have a two-stage cylindrical shape conforming to the TSV holes 31H and 32H.

Figure 4I:
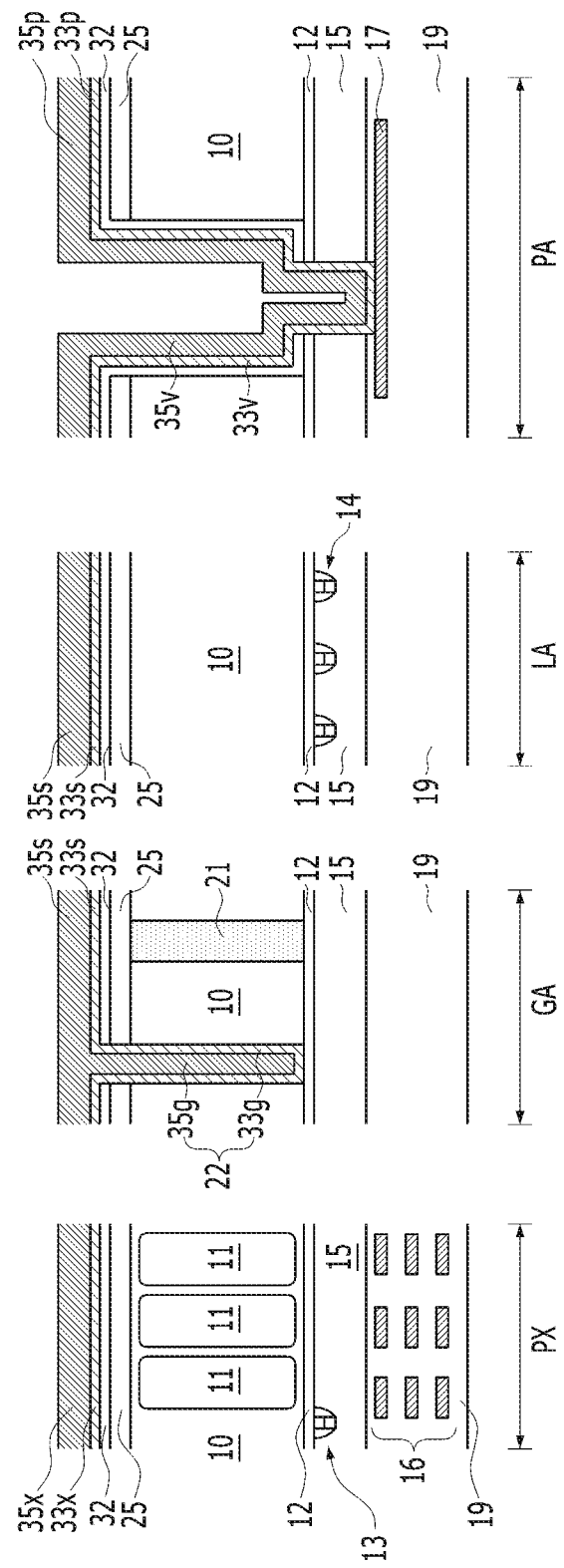

Referring to FIG. 4I, the method may further include forming a guard plug 35g over the guard barrier metal layer 33g and forming a TSV plug 35v over the TSV barrier metal layer 33v by depositing a metal over the profile of the substrate structure. The metal may be, for example, tungsten (W). The guard plug 35g may completely fill the inner guard trench 22T. The TSV plug 35v may be formed conformally over the TSV barrier metal layer 33v, and partially fill the TSV holes 31H and 32H. The TSV plug 35v may have a two-stage cylindrical shape just as the TSV barrier metal layer 33v does. The guard barrier metal layer 33g and the guard plug 35g may form an inner guard dam 22. As shown in FIG. 2, the inner guard dam 22 may have a shape of a frame that surrounds the pixel area PX from a top view perspective.

In this process, a pixel metal layer 35x over the pixel barrier metal layer 33x, a shield metal layer 35s over the shield barrier metal layer 33s, and a lower pad layer 35p over the pad barrier metal layer 33p may be simultaneously formed. The guard plug 35g, the TSV plug 35v, the pixel metal layer 35x, the shield metal layer 35s, and the lower pad layer 35p may include the same material and may form a physical continuum. The guard plug 35g, the TSV plug 35v, the pixel metal layer 35x, the shield metal layer 35s, and the lower pad layer 35p may form a single body.

Figure 4J:
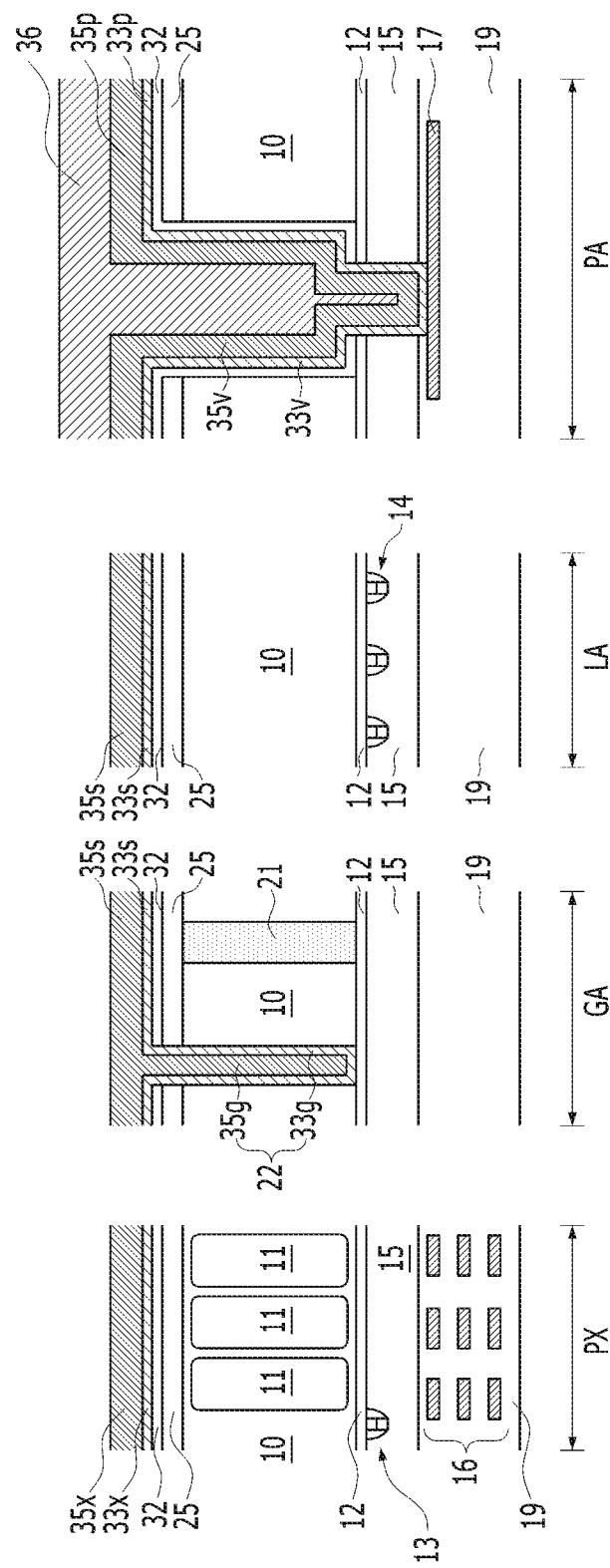

Referring to FIG. 4J, the method may further include forming an upper pad layer 36 in the pad area PA. To be specific, the method may further include forming a metal layer over the TSV plug 35v to fill the TSV holes 31H and 32H by performing a deposition process or a plating process, and removing the pad metal layer from the pixel area PX, the guard area GA and the logic area LA by performing an etch process. In other words, the upper pad layer 36 may be formed in the pad area PA alone. Therefore, the upper pad layer 36 may be formed over the TSV plug 35v to fill the TSV holes 31H and 32H. The upper pad layer 36 may include a metal such as aluminum (Al).

Figure 4K:
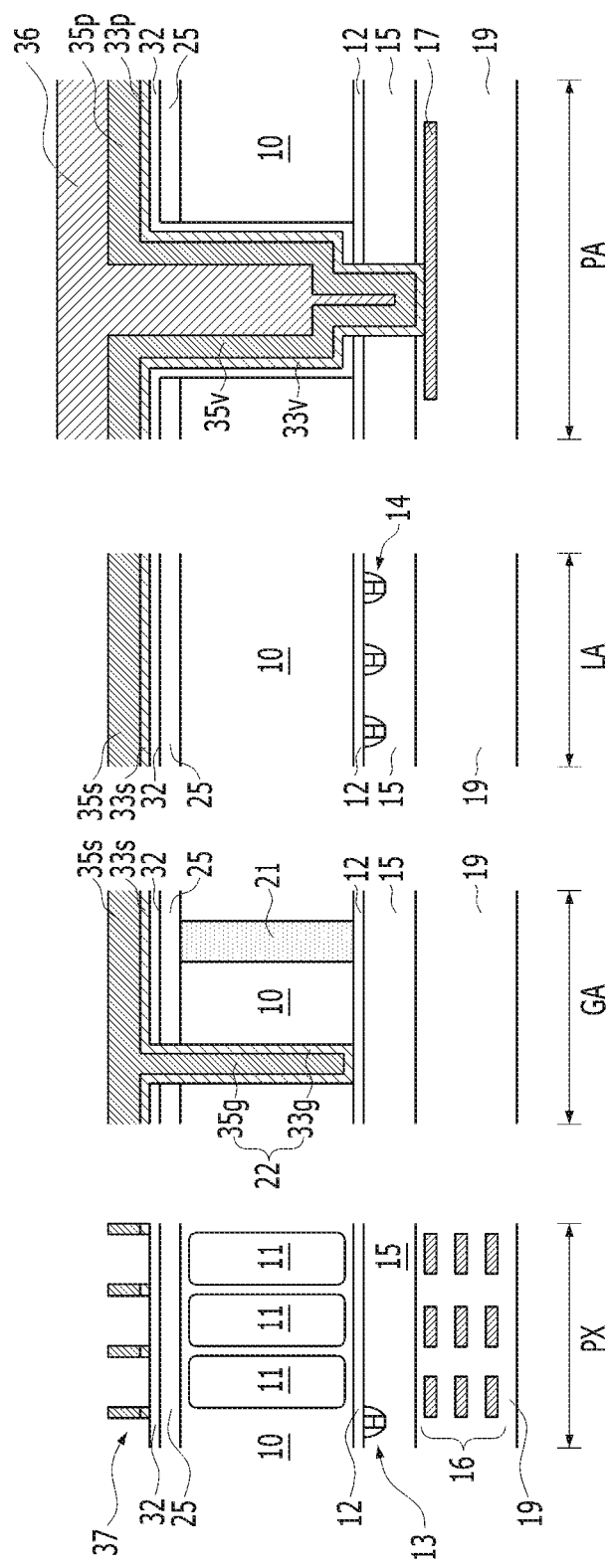

Referring to FIG. 4K, the method may further include forming a pixel grid 37 by patterning the pixel barrier metal layer 33x and the pixel metal layer 35x. The pixel grid 37 may have a form of lattice aligned with the photodiodes 11, from a top view perspective.

Figure 4L:
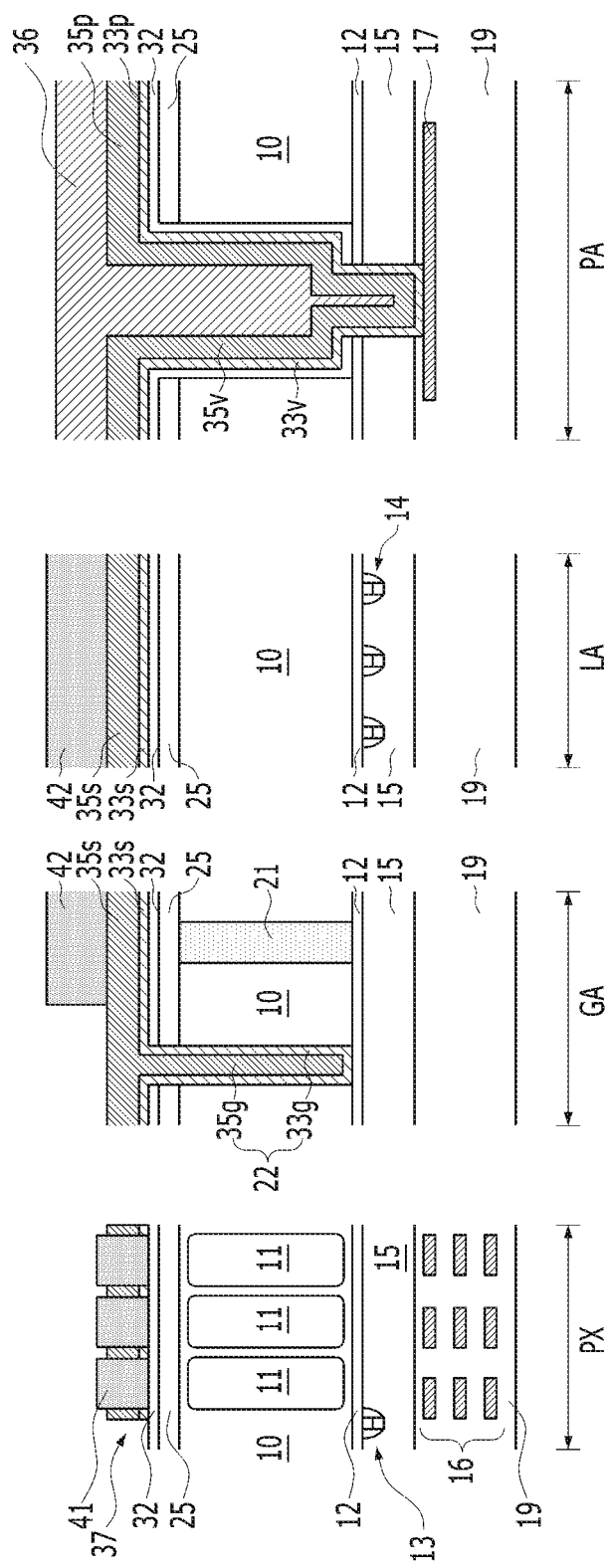

Referring to FIG. 4L, the method may further include forming color filters 41 and a shield pattern 42. The color filters 41 may be formed in the pixel grid 37 of the pixel area PX to be aligned perpendicularly to the photodiodes 11. The shield pattern 42 may be formed in the guard and logic areas GA, and LA to prevent and alleviate the entering and reflection of light from the shield metal layer 35s. The color filters 41 may include polymer organic materials that are formed through diverse processes such as a coating process, a dispensing process, a squeezing process, a spinning process and so forth. The shield pattern 42 may cover part of the guard area GA and most of the logic area LA. For example, the shield pattern 42 may be formed widely over the shield metal layer 35s over the outer guard dam 21 and the shield metal layer 35s over the logic area LA. More specifically, in the guard area GA the shield pattern 42 may be formed to vertically overlap the outer guard dam 21 and not to vertically overlap the inner guard dam 21. The shield pattern 42 may include a polymer organic material including a blue pigment. According to another embodiment, the shield pattern 42 may include a lower shield having the same or similar arrangement as those of the color filters 41 and an upper shield including a blue pigment. For example, one upper shield may be widely formed over a plurality of lower shields.

Subsequently, as shown in FIG. 3A, the method may further include forming an over-coating layer 45 and micro lenses 46. The over-coating layer 45 and the micro lenses 46 may include polymer organic materials. For example, the over-coating layer 45 and the micro lenses 46 may include the same material. The method may further include a heat-emitting opening 48 that is aligned perpendicularly to the inner guard dam 22 of the guard area GA and exposes the surface of the shield metal layer 35s by selectively patterning the over-coating layer 45, and a pad opening 49 that exposes the surface of the upper pad layer 36 of the pad area PA. The micro lenses 46 may be formed only on the pixel area PX over the over-coating layer 45.

FIGS. 5A to 5G are longitudinal cross-sectional views of an image sensor taken along the line I-I' shown in FIG. 2 to describe a method for forming an image sensor 100B of FIG. 3B in accordance with an embodiment of the present invention.

Referring to FIG. 5A, the method for forming the image sensor 100B may include performing the processes described with reference to FIGS. 4A to 4D, and consecutively forming TSV holes 31H and 32H. In other words, the second etch process may include a process of etching the anti-reflective layer 25, a process of etching the substrate 10, a process of etching the surface dielectric layer 12, and a process of etching the lower inter-layer dielectric layer 15 and partly the upper inter-layer dielectric layer 19. When the surface dielectric layer 12 has an excellent etch selectivity with respect to the substrate 10, the lower inter-layer dielectric layer 15 and the upper inter-layer dielectric layer 19, the TSV holes 31H and 32H may have tier-type bottom surfaces. The bottom of the TSV hole 32H may expose the via pad 17. Subsequently, the second mask pattern M2 may be removed.

Figure 5B:
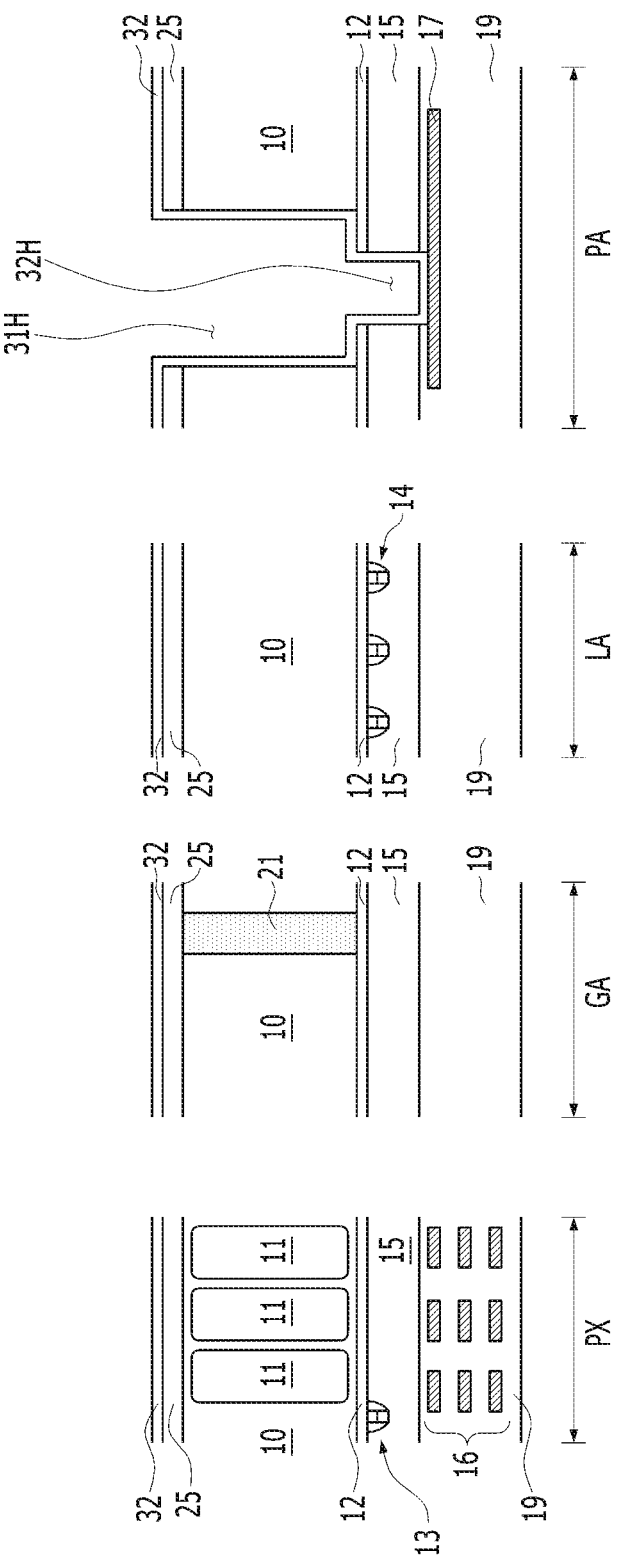

Referring to FIG. 5B, the method may further include forming a lining layer 32 conformally on the inner sidewalls and bottom surfaces of the TSV holes 31H and 32H. The lining layer 32 is also formed over the anti-reflective layer 25 in all of the pixel, guard, logic, and pad areas, PX, GA, LA, and PA.

Figure 5C:
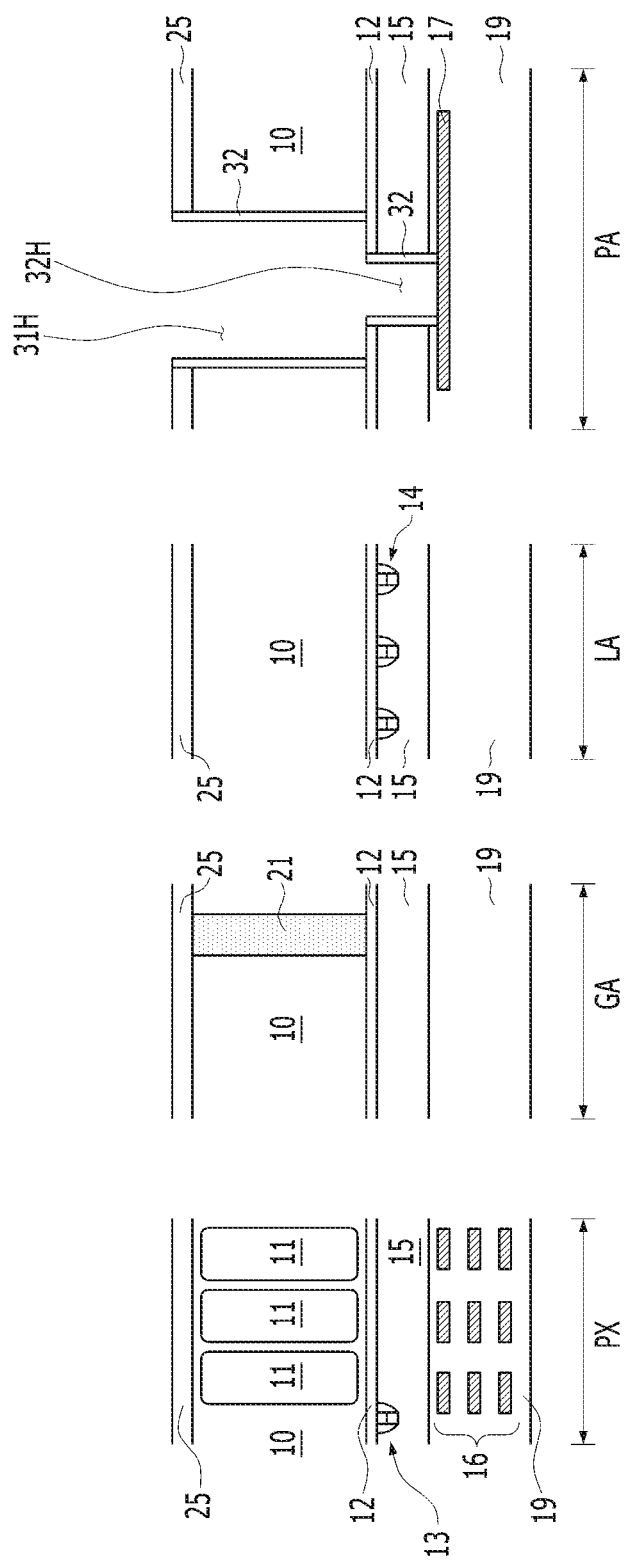

Referring to FIG. 5C, the method may further include removing the lining layer 32 from the surface of the anti-reflective layer 25, the surface dielectric layer 12 that is exposed through the TSV hole 31H and the bottom surface of the TSV hole 32H, which is the upper surface of the via pad 17, by performing an etch-back process. Therefore, the lining layer 32 may remain only on the inner sidewalls of the TSV holes 32H and 31H.

Figure 5D:
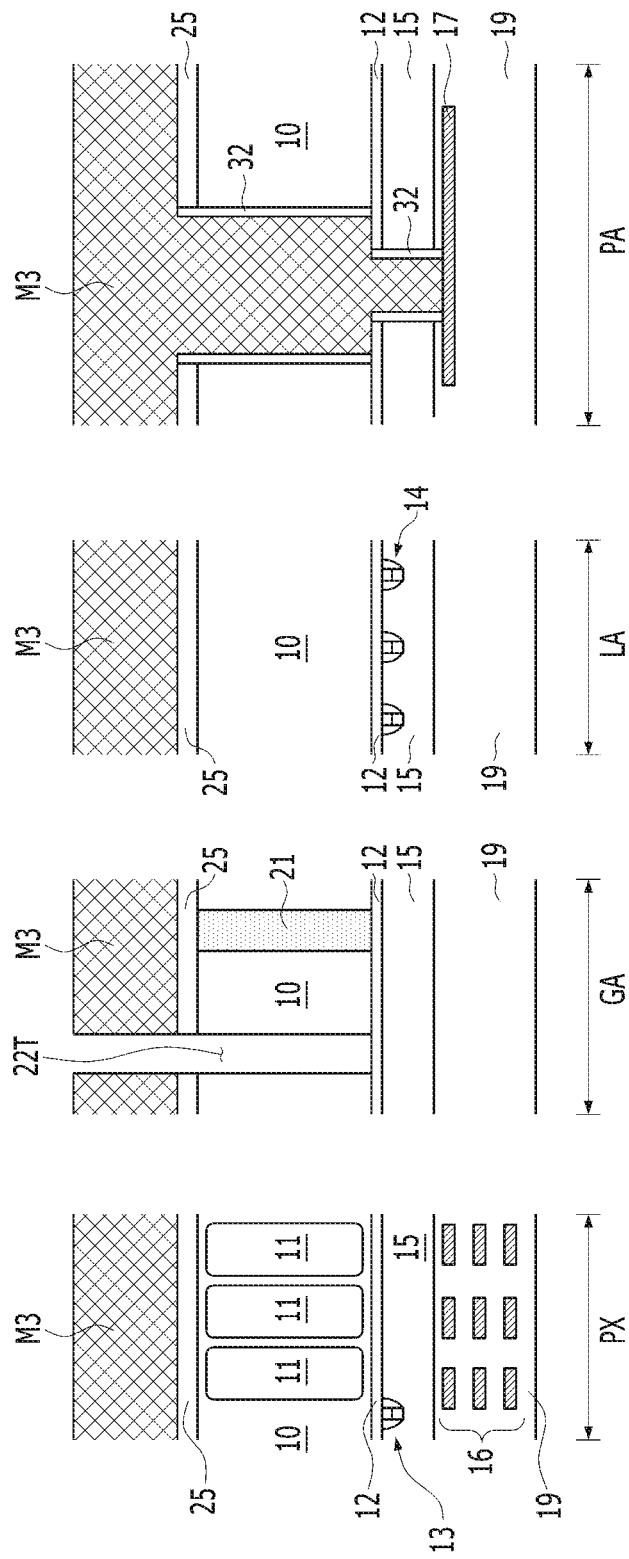

Referring to FIG. 5D, the method may further include forming a third mask pattern M3, and performing a third etch process using the third mask pattern M3 as an etch mask so as to form an inner guard trench 22T. The third etch process may include a process of etching the anti-reflective layer 25 and a process of etching the substrate 10. The surface dielectric layer 12 may be exposed on the bottom surface of the inner guard trench 22T. Subsequently, the third mask pattern M3 may be removed.

Figure 5E:
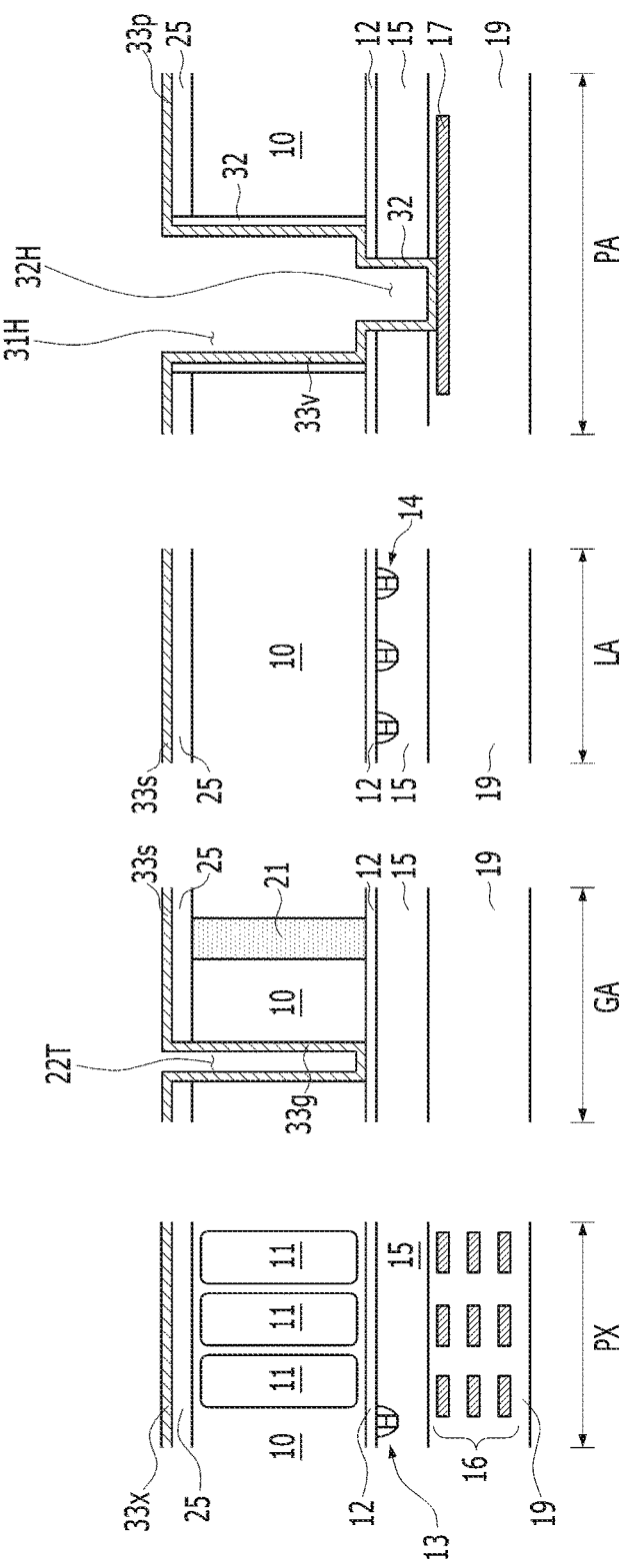

Referring to FIG. 5E, the method may further include forming a pixel barrier metal layer 33x, a guard barrier metal layer 33g, a shield barrier metal layer 33s, a TSV barrier metal layer 33v, and a pad barrier metal layer 33p. The pixel barrier metal layer 33x, the shield barrier metal layer 33s, and the pad barrier metal layer 33p may be directly formed over the anti-reflective layer 25. The guard barrier metal layer 33g, and the TSV barrier metal layer 33v may be formed by conformally depositing a barrier metal over the inner guard trench 22T and the inner sidewalls and bottom surfaces of the upper TSV hole 31H and the lower TSV hole 32H.

Referring to FIG. 5F, the method may further include forming a pixel metal layer 35x over the pixel barrier metal layer 33x, a guard plug 35g over the guard barrier metal layer 33g, a shield metal layer 35s over the shield barrier metal layer 33s, a TSV plug 35v conformally over the TSV barrier metal layer 33v, and a lower pad layer 35p and an upper pad layer 36 over the pad barrier metal layer 33p as shown in FIGS. 4I and 4J.

Referring to FIG. 5G, the method may further include forming a pixel grid 37 as shown in FIG. 4K, and forming color filters 41 and a shield pattern 42 as shown in FIG. 4L.

Subsequently, the method may further include forming an over-coating layer 45 provided with a heat-emitting opening 48 and a pad opening 49 and forming micro lenses 46 as shown in FIG. 3B.

FIGS. 6A to 6F are longitudinal cross-sectional views of an image sensor taken along the line I-I' shown in FIG. 2 to describe methods for forming an image sensor 100C of FIG. 3C in accordance with an embodiment of the present invention.

Referring to FIG. 6A, the method for forming the image sensor 100C may include: preparing a substrate 10 which includes a pixel area PX, a guard area GA, a logic area LA, and a pad area PA; forming photodiodes 11 in the substrate 10 in the pixel area PX; forming a surface dielectric layer 12 on the substrate over a first side (e.g., a front side) of the substrate 10; forming a pixel transistor 13 in the pixel area PX and a logic transistor 14 in the logic area LA, the pixel transistor and the logic transistor being formed over the surface dielectric layer 12; forming a lower inter-layer dielectric layer 15 extending over the surface dielectric layer 12 in all of the pixel, guard, logic and pad areas PX, GA, LA, and PA; forming an upper inter-layer dielectric layer 19 extending over the lower inter-layer dielectric layer 15 in all of the pixel, guard, logic and pad areas PX, GA, LA, and PA; and forming multiple layers of metal interconnections 16 spaced apart at regular intervals in the pixel area PX, a via pad 17 in the pad area PA and a dam pad 18 in the guard area GA, inside the upper inter-layer dielectric layer 19. The dam pad 18 may be formed at the same level as those of one among the multiple layers of the metal interconnections 16 and the via pad 17. Hence, the dam pad 18 may be formed inside the upper inter-layer dielectric layer 19.

Referring to FIG. 6B, the method may further include forming an outer guard dam 21, an anti-reflective layer 25, a TSV hole 31H, and a lining layer 32 through the processes that are described above as shown in FIGS. 4B to 4E.

Referring to FIG. 6C, the method may further include forming an inner guard trench 22T and a TSV hole 32H simultaneously. The inner guard trench 22T may penetrate through the lining layer 32, the anti-reflective layer 25, the substrate 10, the surface dielectric layer 12, and the lower inter-layer dielectric layer 15 and partially penetrate through the upper inter-layer dielectric layer 19 so as to expose the surface of the dam pad 18. The TSV hole 32H may penetrate through the lining layer 32, the surface dielectric layer 12, and the lower inter-layer dielectric layer 15, and partially penetrate through the upper inter-layer dielectric layer 19 so as to expose the surface of the via pad 17.

Referring to FIG. 6D, the method may further include forming barrier metal layers 33x, 33g, 33s, 33v and 33p. The guard barrier metal layer 33g may contact with the dam pad 18.

Figure 6E:
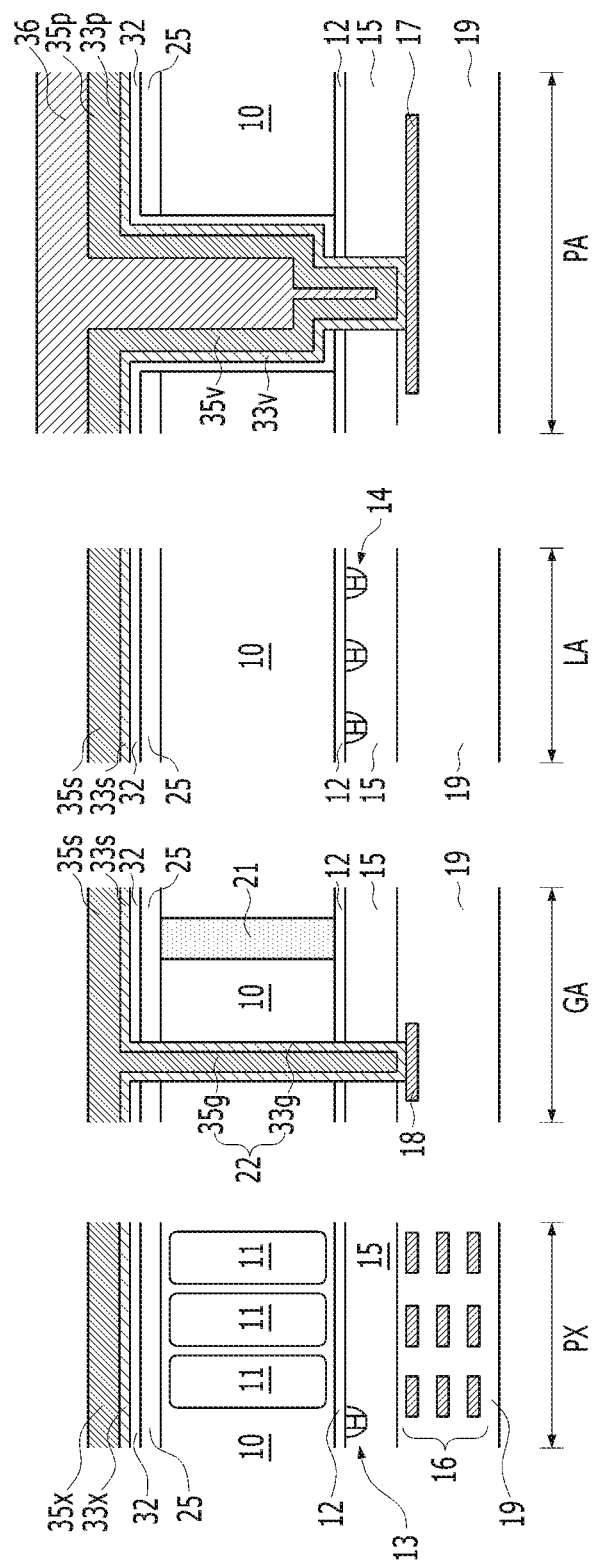

Referring to FIG. 6E, the method may further include forming a pixel metal layer 35x, a guard plug 35g, a shield metal layer 35s, a TSV plug 35v, a lower pad layer 35p, and an upper pad layer 36.

Figure 6F:
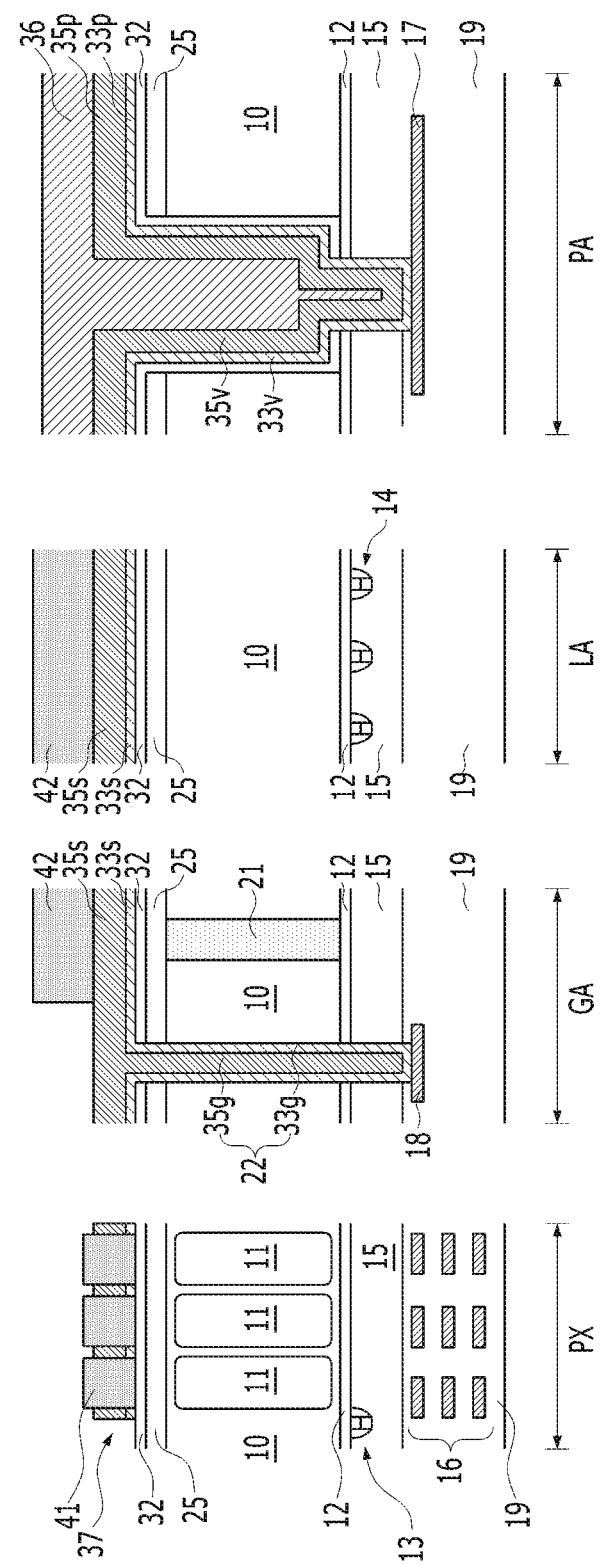

Referring to FIG. 6F, the method may further include forming a pixel grid 37, and forming color filters 41 and a shield pattern 42 as described earlier.

Subsequently, the method may further include forming an over-coating layer 45 provided with a heat-emitting opening 48 and a pad opening 49 and forming micro lenses 46 as shown in FIG. 3C.

Figure 7:
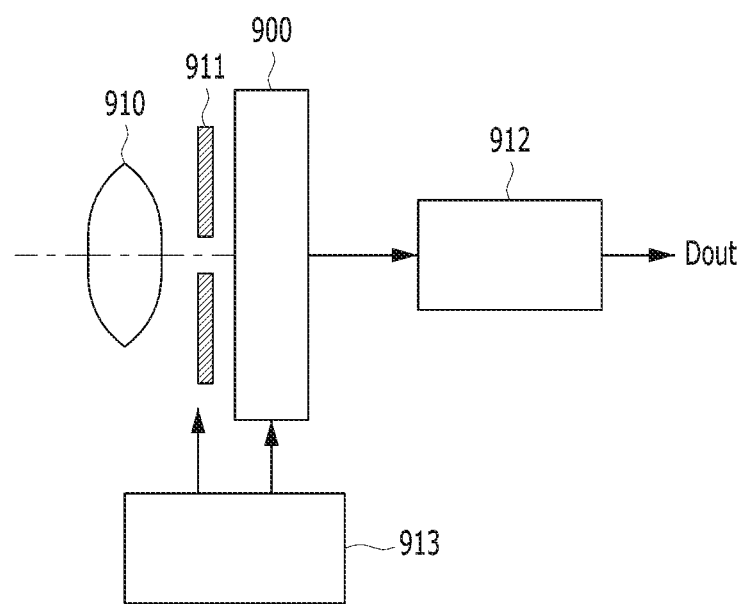
FIG. 7 is a block diagram illustrating an electronic device including at least one image sensor in accordance with an embodiment of the present invention.

FIG. 7 is a block diagram illustrating an electronic device including at least one image sensor among the image sensors 100A to 100C in accordance with various embodiments of the present invention.

Referring to FIG. 7, the electronic device including at least one image sensor device 900 among the image sensors 100A to 100C in accordance with the diverse embodiments of the present invention may include a camera capable of taking a still image or a moving picture. The electronic device may include the image sensor 100, an optical system 910 (or an optical lens), a shutter unit 911, a controller 913 for controlling/driving the shutter unit 911, and a signal processor 912.

The optical system 910 may guide optical image from a subject to a pixel array (e.g., "810" of FIG. 1) of the image sensor 100. The optical system 910 may include a plurality of optical lenses. The shutter unit 911 may control the time for exposing the image sensor 100 to light and shutting it off. The controller 913 may control a transfer operation of the image sensor 100 and a shutter operation of the shutter unit 911. The signal processor 912 may process various kinds of signals outputted from the image sensor 100. Image signals Dout outputted from the signal processor 912 after the signal processing may be stored in a storage medium (not shown), such as a memory, or outputted to a monitor (not shown).

According to an embodiment of the present invention, heat generated in a logic area may be prevented from reaching a pixel area. According to an embodiment heat transfer from a logic area to a pixel area of the image sensor may be prevented by employing a guard area disposed between the logic area and the pixel area wherein the guard area both blocks any heat transfer from the logic area to the pixel area and also emits any heat to an opening away from the pixel area.

According to the present invention, an image sensor is provided that substantially reduces or prevents altogether defects that may be caused by heat reaching a pixel area of the image sensor. The present invention image sensor may, hence, provide excellent image quality.

Other effects of the diverse embodiments of the present invention that are not described herein may be understood from the detailed description of the present invention above.

While the present invention has been described with respect to specific embodiments, it will be apparent to those skilled in the art that various other embodiments, changes and modifications may be made without departing from the spirit and scope of the invention as defined in the following claims.

What is claimed is:

1. An image sensor, comprising:
a substrate including a pixel area, a logic area, and a guard area disposed between the pixel area and the logic area, wherein the guard area comprises:
   a first guard dam including a dielectric material in a first guard trench vertically penetrating the substrate;
   a second guard dam including a conductive guard plug in a second guard trench vertically penetrating the substrate; and
   a shield metal layer formed over an upper side of the substrate,
   wherein the guard plug is coupled to the shield metal layer.

2. The image sensor of claim 1,
wherein the first guard dam and the second guard dam have a shape of a frame surrounding the pixel area from a top view perspective, and
wherein the first guard dam is disposed closer to the logic area than the second guard dam.

3. The image sensor of claim 1, further comprising:
a surface dielectric layer disposed over a lower side of the substrate; and
an anti-reflective layer disposed over the upper side of the substrate,
wherein the first guard dam vertically penetrates the substrate between the surface dielectric layer and the anti-reflective layer.

4. The image sensor of claim 3, wherein the second guard dam vertically penetrates the anti-reflective layer.

5. The image sensor of claim 1, wherein the second guard dam further includes
a guard barrier metal layer surrounding the guard plug, wherein the guard barrier metal layer is conformally formed on the inner sidewall of the second guard trench.

6. The image sensor of claim 5, further comprising:
a shield barrier metal layer formed over the upper side of the substrate in the logic area,
wherein the guard barrier metal layer is coupled to the shield barrier metal layer.

7. The image sensor of claim 5, further comprising:
a through-silicon via (TSV) plug that penetrates through the substrate in the logic area; and
a TSV barrier metal layer that surrounds the TSV plug,
wherein the guard barrier metal layer and the TSV barrier metal layer include the same material, and
the guard plug and the TSV plug include the same material.

8. The image sensor of claim 1, further comprising:
a shield pattern formed over the shield metal layer,
wherein the shield pattern includes a polymer organic material which includes a blue pigment.

9. The image sensor of claim 1, further comprising:
an over-coating layer formed over the shield metal layer,
wherein the over-coating layer includes an opening vertically aligned with the guard plug.

10. The image sensor of claim 1, further comprising:
an inter-layer dielectric layer and multiple layers of metal interconnections that are formed over the substrate within the pixel area; and
a dam pad formed within the guard area at the same level as one of the multiple layers of the metal interconnections,
wherein the second guard dam contacts with the dam pad.

11. An image sensor, comprising:
a first guard dam vertically penetrating a substrate, the first guard dam including a dielectric material in a first guard trench;
a second guard dam vertically penetrating the substrate, the second guard dam including a conductive guard plug in a second guard trench; and
a shield metal layer over an upper side of the substrate,
wherein the shield metal layer and the conductive guard plug include a same metallic material to be continually coupled with each other.

12. The image sensor of claim 11, further comprising:
a surface dielectric layer over a lower side of the substrate;
an anti-reflective layer between the upper side of the substrate and the shield metal layer;
a guard barrier metal layer on inner sidewall of the second guard trench, the guard barrier metal layer surrounding the guard plug;
a shield barrier metal layer between the anti-reflection layer and the shield metal layer,
wherein the shield barrier metal layer and the guard barrier metal layer include a same metallic material to be continually coupled with each other.

13. The image sensor of claim 12, further comprising:
a shield pattern over the shield metal layer; and
an over-coating layer over the shield metal layer,
wherein the over-coating layer has an opening vertically aligned with the second guard dam to expose a portion of a surface of the shield metal layer.

14. The image sensor of claim 11, further comprising:
a lining layer between the anti-reflective layer and the shield barrier metal layer.

15. The image sensor of claim 11,
wherein the first guard dam is electrically insulated from the substrate and the second guard dam is electrically connected with the substrate.

16. An image sensor, comprising:
a substrate including a pixel area, a pad area, and a guard area between the pixel area and the pad area,
wherein:
the pixel area includes a pixel grid on an upper side of the substrate
the pad area includes a TSV plug vertically penetrating the substrate, and
the guard area includes a guard plug vertically penetrating the substrate and a shield metal layer over the upper side of the substrate,
wherein the guard plug and the shield metal layer include a same metallic material to be continually coupled with each other.

17. The image sensor of claim 16, wherein:
the pad area further includes a TSV barrier metal layer surrounding the TSV plug, a pad barrier metal layer and a lower pad layer over the upper side of the substrate,
the TSV barrier metal layer and the pad barrier metal layer include a same metallic material to be continually coupled with each other, and the TSV plug and the lower pad layer include a same metallic material to be continually coupled with each other.

18. The image sensor of claim 17,
wherein the pad layer further comprises an upper pad layer,
wherein the upper pad layer has a vertical portion surrounded by the TSV plug, and a horizontal portion over the lower pad layer.

19. The image sensor of claim 18, further comprising:
a shield pattern over the shield metal layer;
an over-coating layer over the shield metal layer,
wherein the over-coating layer has a first opening vertically aligned with the guard plug to expose a portion of a surface of the shield metal layer, and a second opening vertically aligned with the TSV plug to expose a portion of a surface of the pad layer.

20. The image sensor of claim 16, further comprising:
a surface dielectric layer over a lower side of the substrate;
an anti-reflective layer between the upper side of the substrate and the shield metal layer;
a guard barrier metal layer surrounding the guard plug; and
a shield barrier metal layer between the anti-reflection layer and the shield metal layer,
wherein the guard barrier metal layer and the shield barrier metal layer include a same metallic material to be continually coupled with each other.

* * * * *